United States Patent
Gagne et al.

(10) Patent No.: US 9,367,810 B1
(45) Date of Patent: Jun. 14, 2016

(54) OPERATIONS MATURITY MODEL

(71) Applicant: PagerDuty, Inc., San Francisco, CA (US)

(72) Inventors: Christopher Stanleigh Ronan Gagne, San Francisco, CA (US); David Hayes, San Francisco, CA (US); David Allen Lax Shackelford, San Francisco, CA (US); Divakar Chandra Shekhar, San Francisco, CA (US)

(73) Assignee: PagerDuty, Inc., San Francisco, CA (US)

( * ) Notice: Subject to any disclaimer, the term of this patent is extended or adjusted under 35 U.S.C. 154(b) by 0 days.

(21) Appl. No.: 14/881,366

(22) Filed: Oct. 13, 2015

(51) Int. Cl.
*G06F 17/00* (2006.01)
*G06N 5/04* (2006.01)
*G06F 11/07* (2006.01)
*G06Q 10/00* (2012.01)

(52) U.S. Cl.
CPC .............. *G06N 5/04* (2013.01); *G06F 11/079* (2013.01); *G06Q 10/00* (2013.01)

(58) Field of Classification Search
None
See application file for complete search history.

(56) References Cited

U.S. PATENT DOCUMENTS

2013/0173353 A1* 7/2013 Kamath ................. G06Q 10/04 705/7.39
2014/0344009 A1* 11/2014 Coppinger ......... G06Q 10/0637 705/7.28

OTHER PUBLICATIONS

Xirogiannis et al. "Intelligent modeling of e-business maturity", Expert Systems with Applications, 2007, pp. 687-702.*
Feature Scaling, Wikipedia, https://web.archive.org/web/20150604201800/http://en.wikipedia.org/wiki/Feature_scaling, Jun. 2015, pp. 3.*
Lee et al. "Strategic Planning Simulation Based on Fuzzy Cognitive Map Knowledge and Differential Game", Simulation, 1998, pp. 316-327.*

* cited by examiner

*Primary Examiner* — Li-Wu Chang
(74) *Attorney, Agent, or Firm* — John W. Branch; Lowe Graham Jones PLLC

(57) ABSTRACT

Embodiments are directed towards an operations maturity model. An operations management system may associate events with one or more organizations. Event metric information may be provided based on the events for one or more sub-scores. The sub-scores may be scaled to fit within a defined range. An operations maturity score may be provided for the organizations that may be based on the scaled sub-scores. One or more recommendations may be provided to increase the operations maturity score for the organizations based on operations maturity scores that correspond to the one or more organizations. Providing the recommendations, includes providing a correlation of operations practices and the sub-scores and providing configuration recommendations based on the operations practices that are correlated with above average sub-scores.

26 Claims, 12 Drawing Sheets

| Sub Score | Scale | 1%ile (raw) | 99%ile (raw) | 1%ile (scaled) | 99%ile (scaled) | % of final score |
|---|---|---|---|---|---|---|
| Mean time to acknowledge (MTTA) | log(x) | 26 sec | 18,615 sec | 1.415 | 4.27 | 20% |
| Mean time to resolve (MTTR) | log(x) | 90 sec | 65,877 sec | 1.954 | 4.819 | 20% |
| Incidents/Resolver Ratio | log(x) | 3.2 | 1759.75 | 0.505 | 3.245 | 10% |
| Escalation Ratio | sqrt(x) | 0 | 7.41 | 0 | 2.722 | 20% |
| Assignment/Incidents Ratio | log(x) | 1 | 6.93 | 0 | 0.841 | 10% |
| Auto-resolve Rate | log(x*100) | 0% | 89% | 0 | 1.948 | 10% |
| Unique/Total Incident Ratio | Linear | 0% | 100% | 0% | 100% | 10% |

Fig. 5

OPERATIONS MATURITY MODEL

TECHNICAL FIELD

The present invention relates generally to computer operations and more particularly, but not exclusively to providing a model for evaluating an organization's computer operations maturity.

BACKGROUND

Information technology has become an increasingly important and indispensable component required for the operation of most modern enterprises. This increased dependency on information technology often requires dedicated support resources be readily accessible to resolve planned or unplanned incidents that may affect the operation the information technology infrastructure. Further, computer operations for complex environments may involve employing various best practices to obtain results that may be comparable to other organizations. Also, the needs, available resources, and expertise in computer operations may vary widely between organizations. Accordingly, it may be difficult to determine if an organization's computer operations are up to a standard. Thus, it is with respect to these considerations and others that the present invention has been made.

BRIEF DESCRIPTION OF THE DRAWINGS

Non-limiting and non-exhaustive embodiments of the present innovations are described with reference to the following drawings. In the drawings, like reference numerals refer to like parts throughout the various figures unless otherwise specified. For a better understanding of the described innovations, reference will be made to the following Description of Various Embodiments, which is to be read in association with the accompanying drawings, wherein:

FIG. 5 illustrates a table that includes a portion of the sub-score that may be generated for providing operational maturity scores, in accordance with at least one of the various embodiments;

DETAILED DESCRIPTION OF THE EMBODIMENTS

Figure 1:
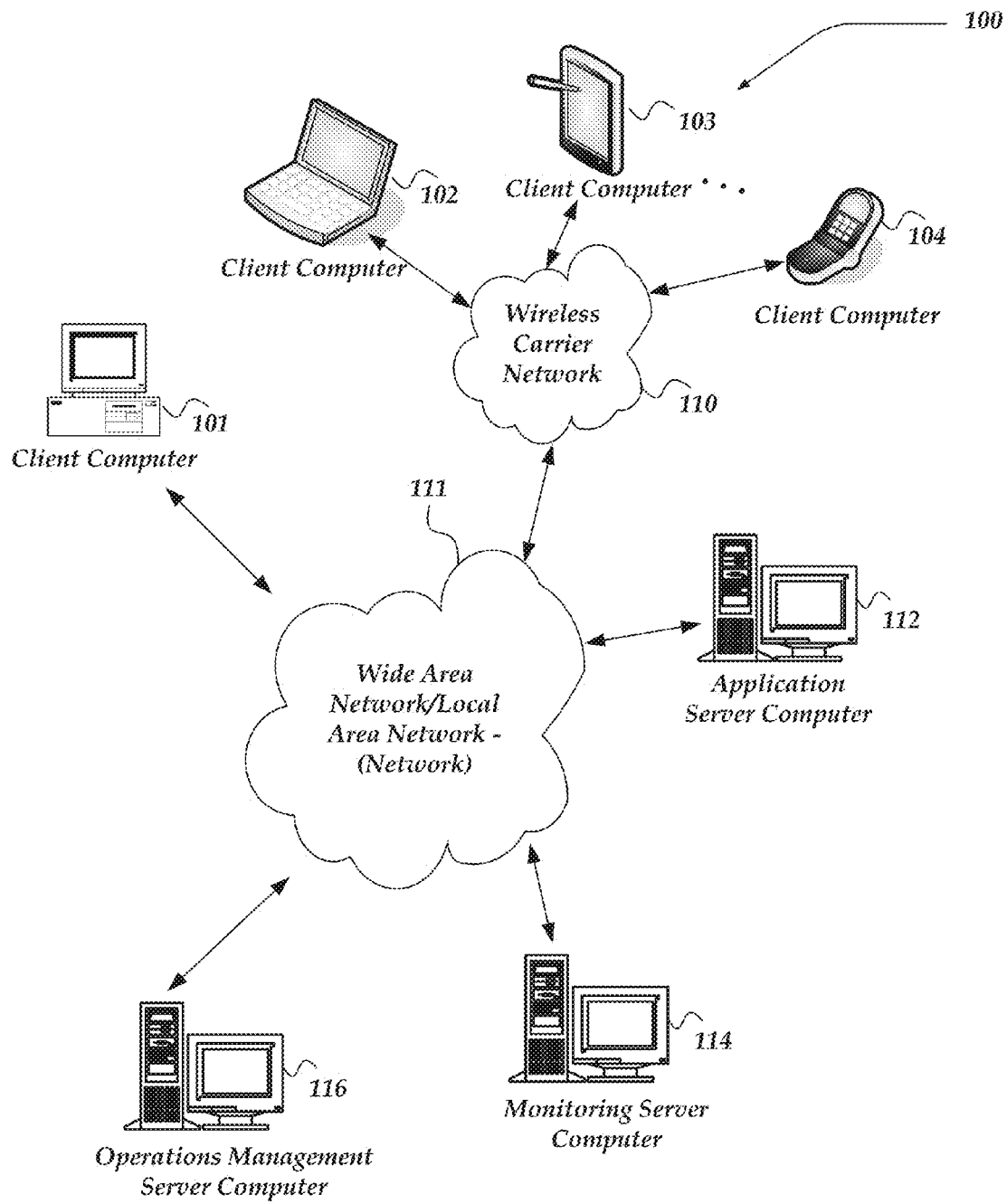
FIG. 1 shows components of one embodiment of an environment in which embodiments of the invention may be practiced.

Various embodiments now will be described more fully hereinafter with reference to the accompanying drawings, which form a part hereof, and which show, by way of illustration, specific exemplary embodiments by which the invention may be practiced. The embodiments may, however, be embodied in many different forms and should not be construed as limited to the embodiments set forth herein; rather, these embodiments are provided so that this disclosure will be thorough and complete, and will fully convey the scope of the embodiments to those skilled in the art. Among other things, the various embodiments may be methods, systems, media or devices. Accordingly, the various embodiments may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

For example embodiments, the following terms are also used herein according to the corresponding meaning, unless the context clearly dictates otherwise.

The term "organization" as used herein refers to a business, a company, an association, an enterprise, a confederation, or the like.

The term "operations management system" as used herein is computer system that may be arranged to monitor, manage, and compare, the operations of one or more organizations. Operations management system may be arranged to accept various operations events that indicate events and/or incidents occurring in the managed organizations. Operations management systems may be arranged to manage several separate organizations at the same time. These separate organizations may be considered a community of organizations.

The term "operations maturity" as used herein refers to an organization's maturity with respect to how it conducts its operations. Organizations that have a high level of operations maturity may be using industry best practices, and so on, to reduce operations errors and inefficacies.

The terms "event," "operations event" as used herein refer one or more outcomes, conditions, or occurrences that may be detected or observed by an operations management system. Operations management systems may be configured to monitor various types of events depending on needs of an industry and/or technology area. For example, information technology services may generate events in response to one or more conditions, such as, computers going offline, memory overutilization, CPU overutilization, storage quotas being met or exceeded, applications failing or otherwise becoming unavailable, networking problems (e.g., latency, excess traffic, unexpected lack of traffic, intrusion attempts, or the like), electrical problems (e.g., power outages, voltage fluctuations, or the like), customer service requests, or the like, or combination thereof.

Events and/or operations events may be provided using one or more messages, emails, telephone calls, library function calls, application programming interface (API) calls, or any signals provided to an operations management system indicating that an event was detected that may need to be brought to the attention of a resource. Third party systems may be arbitrarily configured to generate event messages that are provided to the operations management system.

The term "operations event" or used herein may be a record, message, event, incident, or other indication that something related to the operations of an organization has occurred. Often these may be "events" as defined above. Also, they may include customer service calls, customer complaints, inventory management alerts, or the like, that may be provided to the operations management system.

The terms "operational maturity sub-score," or "sub-score" as used herein may refer to a numerical value that represents at least one dimension of the operations maturity of an organization. Sub-scores may be based on one or more metrics and/or computations of metrics, such as, mean-time-to-acknowledge (MTTA), mean-time-to-resolve (MTTR), incident count per resolvers, resolution escalations, uniqueness of events, auto-resolve rate, time-of-day of incidents, adjusting for multiple events per single incident, or the like, or combination thereof. Also, in at least one of the various embodiments, computed metrics may include time-to-discovery, time-to-acknowledgement, time-to-resolution, or transformations of these metrics, such as, mean, median, percentile, or the like. Further, one of ordinary skill in the art will appreciate that there are other relevant metrics that may be generated, measured, or collected to use in sub-scores. It is in the interest of clarity and brevity that the description of additional metrics is omitted.

Sub-scores may be scaled and normalized across organizations to enable various comparisons. Accordingly, higher sub-scores may indicate a higher level of operations maturity.

The term "operations maturity score" as used herein may be a value comprised of weighted values if the one or more sub-scores. Different sub-scores may have different weights depending on their contributions to the operations maturity of the organization. The operations maturity score may be arranged to be a single value that represents the operations maturity of an organization. Since the score may be generated consistently across multiple organizations the score may be useful for comparing an organization operations maturity level to other organizations.

The following briefly describes the embodiments of the invention in order to provide a basic understanding of some aspects of the invention. This brief description is not intended as an extensive overview. It is not intended to identify key or critical elements, or to delineate or otherwise narrow the scope. Its purpose is merely to present some concepts in a simplified form as a prelude to the more detailed description that is presented later.

Briefly stated, various embodiments are directed towards an operations maturity model. In at least one of the various embodiments, an operations management system may associate one or more events with one or more organizations. In at least one of the various embodiments, event metric information may be provided based on the one or more events for one or more sub-scores. In at least one of the various embodiments, the one or more sub-scores that are provided may be scaled to fit within a defined range. In at least one of the various embodiments, providing the one or more sub-scores may be scaled based on one or more of a plurality of scaling functions. And, if the one or more scaled sub-scores are less than a defined lowest value, the value of the one or more scaled sub-scores may be set to the defined lowest value. Also, if the one or more scaled sub-scores exceed a defined highest value, the value of the one or more scaled sub-scores may be set to the defined highest value.

In at least one of the various embodiments, an operations maturity score may be provided for the one or more organizations that may be based on a plurality of scaled sub-scores. In at least one of the various embodiments, the one or more sub-scores may be provided based on a weighting that corresponds to a contribution of the one or more sub-scores to the operations maturity score. And, the one or more values for the one or more weighted sub-scores may be provided for the operations maturity score.

In at least one of the various embodiments, one or more recommendations may be provided to increase the operations maturity score for the one or more organizations based on operations maturity scores that correspond to the one or more organizations. In at least one of the various embodiments, providing the one or more recommendations, includes providing a correlation of the one or more operations practices and the one or more sub-scores; and providing one or more configuration recommendations based on the one or more operations practices that are correlated with above average sub-scores.

In at least one of the various embodiments, a comparison of the one or more sub-scores for the one or more organizations may be provided. In at least one of the various embodiments, the provided one or more comparisons of the one or more sub-scores to another one or more of the organizations may be based on a type of organization.

In at least one of the various embodiments, sensing geolocation information provided by one or more geolocation devices may be employed to perform one or more actions, such as, modifying the one or more sub-scores based at least on the sensed information; or localizing the one or more recommendations based at least on the sensed information.

In at least one of the various embodiments, an operations maturity trend line based on at least one or more previous sub-scores for the one or more organizations may be provided.

In at least one of the various embodiments, an application store may be provided that includes a user-interface that at least displays one or more applications that are offered. In at least one of the various embodiments, if the one or more applications are correlated with one or more above average sub-score values, modifying the application store to show that there is an advantage to using the one or more correlated applications.

Illustrated Operating Environment

FIG. 1 shows components of one embodiment of an environment in which the invention may be practiced. Not all the components may be required to practice various embodiments, and variations in the arrangement and type of the components may be made. As shown, system 100 of FIG. 1 includes local area networks ("LANs")/wide area networks ("WANs")—(network) 111, wireless network 110, client computers 101-104, application server 112, monitoring server 114, and operations management server computer 116.

Generally, client computers 102-104 may include virtually any portable computing device capable of receiving and sending a message over a network, such as network 111, wireless network 110, or the like. Client computers 102-104 may also be described generally as client computers that are configured to be portable. Thus, client computers 102-104 may include virtually any portable computing device capable of connecting to another computing device and receiving information. Such devices include portable devices such as, cellular telephones, smart phones, display pagers, radio frequency (RF) devices, infrared (IR) devices, Personal Digital Assistants (PDA's), handheld computers, laptop computers, wearable computers, tablet computers, integrated devices combining one or more of the preceding devices, or the like. As such, client computers 102-104 typically range widely in terms of capabilities and features. For example, a cell phone may have a numeric keypad and a few lines of monochrome Liquid Crystal Display (LCD) on which only text may be displayed. In another example, a web-enabled mobile device may have a touch sensitive screen, a stylus, and several lines of color LCD in which both text and graphics may be displayed.

Client computer 101 may include virtually any computing device capable of communicating over a network to send and receive information, including messaging, performing various online actions, or the like. The set of such devices may include devices that typically connect using a wired or wireless communications medium such as personal computers, multiprocessor systems, microprocessor-based or programmable consumer electronics, network Personal Computers (PCs), or the like. In one embodiment, at least some of client computers 102-104 may operate over wired and/or wireless network. Today, many of these devices include a capability to access and/or otherwise communicate over a network such as network 111 and/or even wireless network 110. Moreover, client computers 102-104 may access various computing applications, including a browser, or other web-based application.

In one embodiment, one or more of client computers 101-104 may be configured to operate within a business or other entity to perform a variety of services for the business or other entity. For example, client computers 101-104 may be configured to operate as a web server, an accounting server, a production server, an inventory server, or the like. However, client computers 101-104 are not constrained to these services and may also be employed, for example, as an end-user computing node, in other embodiments. Further, it should be recognized that more or less client computers may be included within a system such as described herein, and embodiments are therefore not constrained by the number or type of client computers employed.

A web-enabled client computer may include a browser application that is configured to receive and to send web pages, web-based messages, or the like. The browser application may be configured to receive and display graphics, text, multimedia, or the like, employing virtually any web-based language, including a wireless application protocol messages (WAP), or the like. In one embodiment, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), HTML5, or the like, to display and send a message. In one embodiment, a user of the client computer may employ the browser application to perform various actions over a network.

Client computers 101-104 also may include at least one other client application that is configured to receive and/or send data, operations information, between another computing device. The client application may include a capability to provide requests and/or receive data relating to managing, operating, or configuring the operations management server computer 116.

Wireless network 110 is configured to couple client computers 102-104 and its components with network 111. Wireless network 110 may include any of a variety of wireless sub-networks that may further overlay stand-alone ad-hoc networks, or the like, to provide an infrastructure-oriented connection for client computers 102-104. Such sub-networks may include mesh networks, Wireless LAN (WLAN) networks, cellular networks, or the like.

Wireless network 110 may further include an autonomous system of terminals, gateways, routers, or the like connected by wireless radio links, or the like. These connectors may be configured to move freely and randomly and organize themselves arbitrarily, such that the topology of wireless network 110 may change rapidly.

Wireless network 110 may further employ a plurality of access technologies including 2nd (2G), 3rd (3G), 4th (4G), 5th (5G) generation radio access for cellular systems, WLAN, Wireless Router (WR) mesh, or the like. Access technologies such as 2G, 3G, 4G, and future access networks may enable wide area coverage for mobile devices, such as client computers 102-104 with various degrees of mobility. For example, wireless network 110 may enable a radio connection through a radio network access such as Global System for Mobil communication (GSM), General Packet Radio Services (GPRS), Enhanced Data GSM Environment (EDGE), Wideband Code Division Multiple Access (WCDMA), or the like. In essence, wireless network 110 may include virtually any wireless communication mechanism by which information may travel between client computers 102-104 and another computing device, network, or the like.

Network 111 is configured to couple network devices with other computing devices, including, schedule manager server 116, monitoring server 114, application server 112, client computer(s) 101, and through wireless network 110 to client computers 102-104. Network 111 is enabled to employ any form of computer readable media for communicating information from one electronic device to another. Also, network 111 can include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. In addition, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. For example, various Internet Protocols (IP), Open Systems Interconnection (OSI) architectures, and/or other communication protocols, architectures, models, and/or standards, may also be employed within network 111 and wireless network 110. Furthermore, remote computers and other related electronic devices could be remotely connected to either LANs or WANs via a modem and temporary telephone link. In essence, network 111 includes any communication method by which information may travel between computing devices.

Additionally, communication media typically embodies computer-readable instructions, data structures, program modules, or other transport mechanism and includes any information delivery media. By way of example, communication media includes wired media such as twisted pair, coaxial cable, fiber optics, wave guides, and other wired media and wireless media such as acoustic, RF, infrared, and other wireless media. Such communication media is distinct from, however, computer-readable devices described in more detail below.

Figure 3:
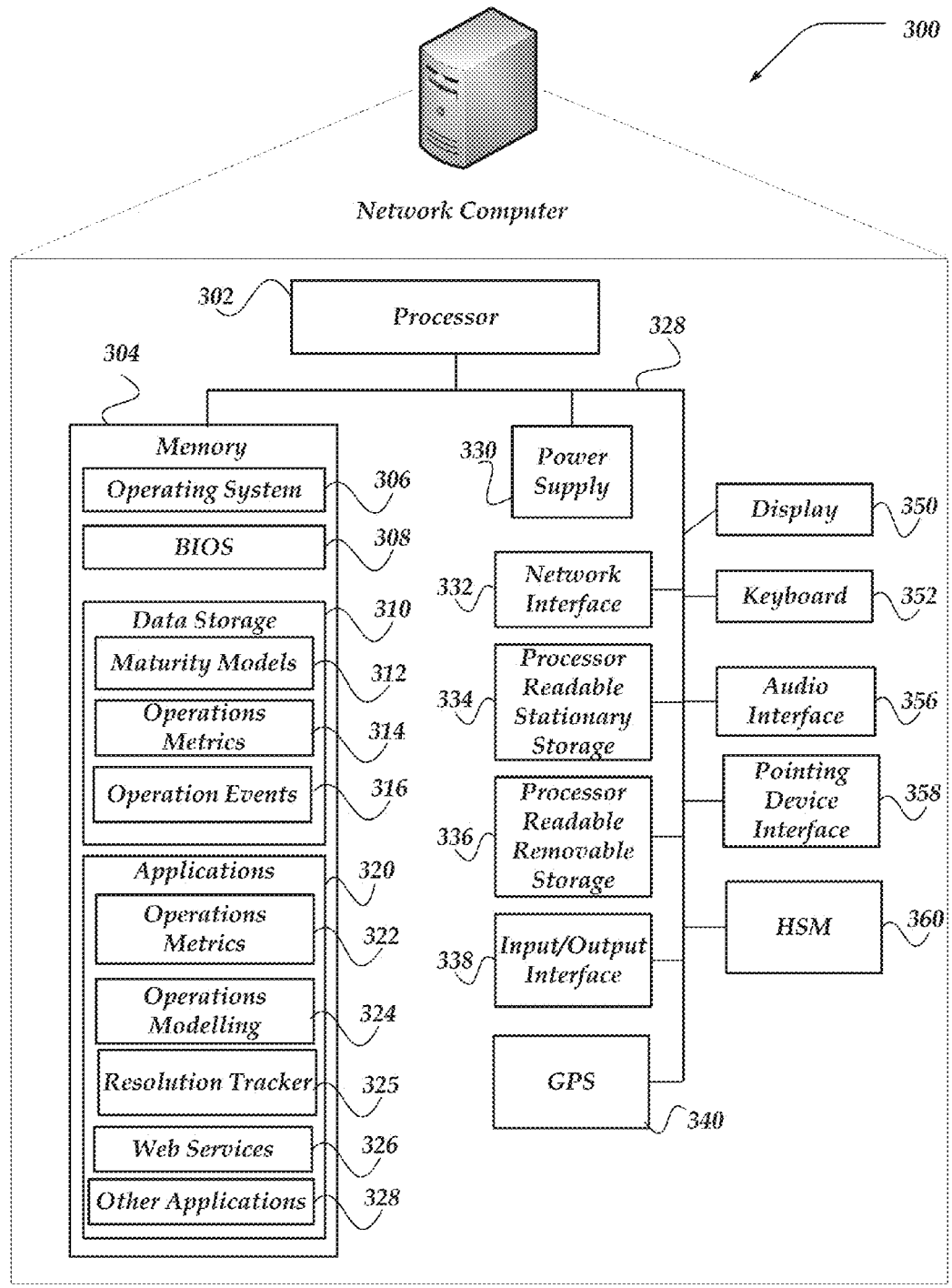
FIG. 3 shows one embodiment of a network computer, in accordance with at least one of the various embodiments.

Operations management server computer 116 may include virtually any network computer usable to provide computer operations management services, such as network computer 300 of FIG. 3. In one embodiment, operations management server computer 116 employs various techniques for generation of managing the operations of computer operations, networking performance, customer service, customer support, resource schedules and notification policies. Also, operations management server computer 116 may be arranged to interface/integrate with one or more external systems such as telephony carriers, email systems, web services, or the like, to perform computer operations management. Further, operations management server computer 116 may obtain various performance metrics collected by other systems, such as, monitoring server computer 114.

In at least one of the various embodiments, monitoring server computer 114 represents various computers that may be arranged to monitor the performance of computer operations for an entity (e.g., company or enterprise). For example, monitoring server computer 114 may be arranged to monitor whether applications/system are operational, network performance, trouble tickets and/or their resolution, or the like. In some embodiments, the functions of monitoring server computer 114 may be performed by operations management server computer 116.

Devices that may operate as operations management server computer 116 include various network computers, including, but not limited to personal computers, desktop computers, multiprocessor systems, microprocessor-based or programmable consumer electronics, network PCs, server devices, network appliances, or the like. It should be noted that while operations management server computer 116 is illustrated as a single network computer, the invention is not so limited. Thus, operations management server computer 116 may represent a plurality of network computers. For example, in one embodiment, operations management server computer 116 may be distributed over a plurality of network computers and/or implemented using cloud architecture.

Moreover, operations management server computer 116 is not limited to a particular configuration. Thus, operations management server computer 116 may operate using a master/slave approach over a plurality of network computers, within a cluster, a peer-to-peer architecture, and/or any of a variety of other architectures. Thus, operations management server computer 116 is not to be construed as being limited to a single environment, and other configurations, and architectures are also contemplated. operations management server computer 116 may employ processes such as described below in conjunction with at some of the figures discussed below to perform at least some of its actions.

Illustrative Client Computer

Figure 2:
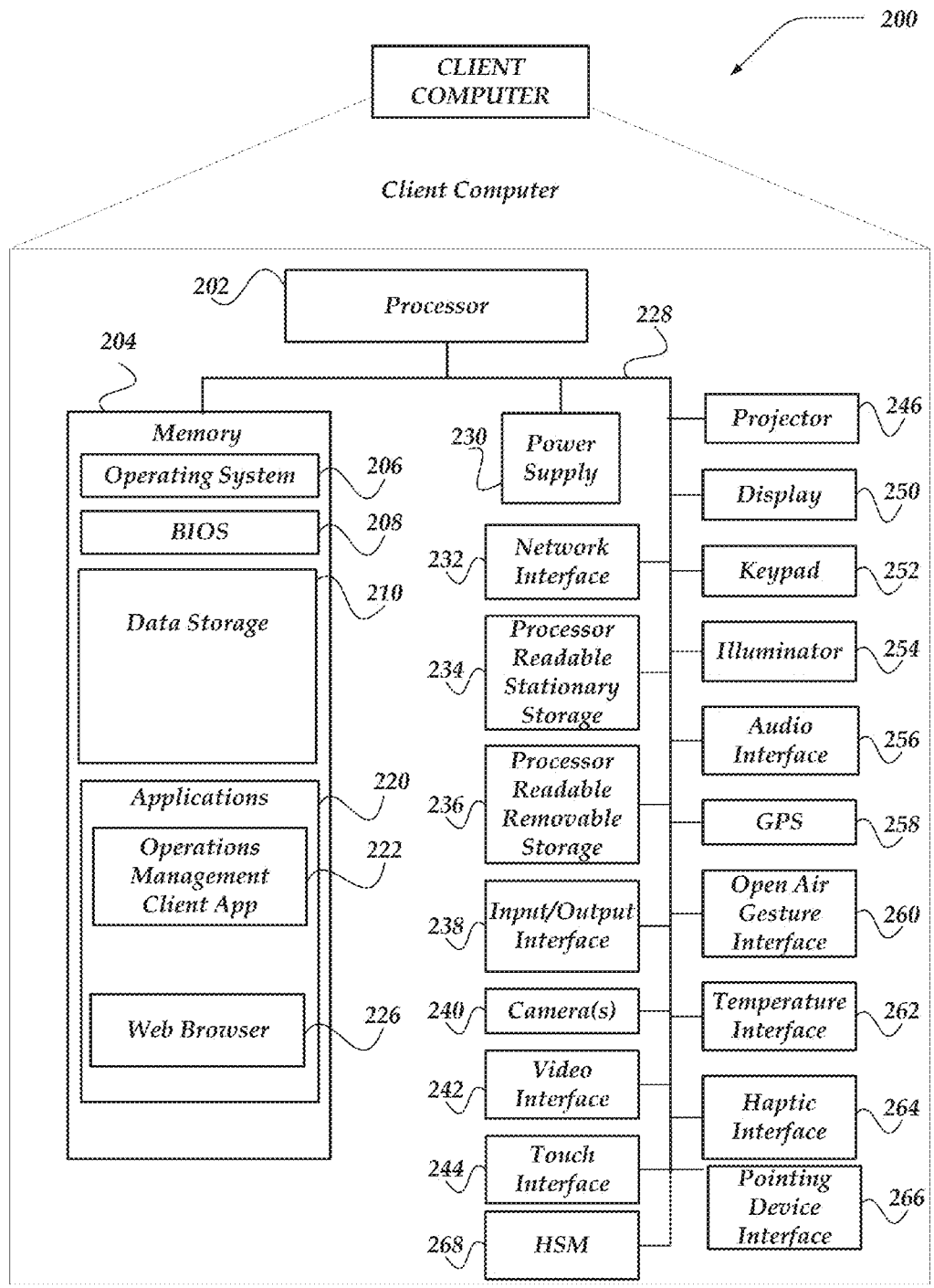
FIG. 2 shows one embodiment of a client computer that may be included in a system in accordance with at least one of the various embodiments.

FIG. 2 shows one embodiment of client computer 200 that may include many more or less components than those shown. Client computer 200 may represent, for example, at least one embodiment of mobile computers or client computers shown in FIG. 1.

Client computer 200 may include processor 202 in communication with memory 204 via bus 228. Client computer 200 may also include power supply 230, network interface 232, audio interface 256, display 250, keypad 252, illuminator 254, video interface 242, input/output interface 238, haptic interface 264, global positioning systems (GPS) receiver 258, open air gesture interface 260, temperature interface 262, camera(s) 240, projector 246, pointing device interface 266, processor-readable stationary storage device 234, and processor-readable removable storage device 236. Client computer 200 may optionally communicate with a base station (not shown), or directly with another computer. And in one embodiment, although not shown, a gyroscope may be employed within client computer 200 to measuring and/or maintaining an orientation of client computer 200.

Power supply 230 may provide power to client computer 200. A rechargeable or non-rechargeable battery may be used to provide power. The power may also be provided by an external power source, such as an AC adapter or a powered docking cradle that supplements and/or recharges the battery.

Network interface 232 includes circuitry for coupling client computer 200 to one or more networks, and is constructed for use with one or more communication protocols and technologies including, but not limited to, protocols and technologies that implement any portion of the OSI model for mobile communication (GSM), CDMA, time division multiple access (TDMA), UDP, TCP/IP, SMS, MMS, GPRS, WAP, UWB, WiMax, SIP/RTP, GPRS, EDGE, WCDMA, LTE, UMTS, OFDM, CDMA2000, EV-DO, HSDPA, or any of a variety of other wireless communication protocols. Network interface 232 is sometimes known as a transceiver, transceiving device, or network interface card (NIC).

Audio interface 256 may be arranged to produce and receive audio signals such as the sound of a human voice. For example, audio interface 256 may be coupled to a speaker and microphone (not shown) to enable telecommunication with others and/or generate an audio acknowledgement for some action. A microphone in audio interface 256 can also be used for input to or control of client computer 200, e.g., using voice recognition, detecting touch based on sound, and the like.

Display 250 may be a liquid crystal display (LCD), gas plasma, electronic ink, light emitting diode (LED), Organic LED (OLED) or any other type of light reflective or light transmissive display that can be used with a computer. Display 250 may also include a touch interface 244 arranged to receive input from an object such as a stylus or a digit from a human hand, and may use resistive, capacitive, surface acoustic wave (SAW), infrared, radar, or other technologies to sense touch and/or gestures.

Projector 246 may be a remote handheld projector or an integrated projector that is capable of projecting an image on a remote wall or any other reflective object such as a remote screen.

Video interface 242 may be arranged to capture video images, such as a still photo, a video segment, an infrared video, or the like. For example, video interface 242 may be coupled to a digital video camera, a web-camera, or the like. Video interface 242 may comprise a lens, an image sensor, and other electronics. Image sensors may include a complementary metal-oxide-semiconductor (CMOS) integrated circuit, charge-coupled device (CCD), or any other integrated circuit for sensing light.

Keypad 252 may comprise any input device arranged to receive input from a user. For example, keypad 252 may include a push button numeric dial, or a keyboard. Keypad 252 may also include command buttons that are associated with selecting and sending images.

Illuminator 254 may provide a status indication and/or provide light. Illuminator 254 may remain active for specific periods of time or in response to event messages. For example, when illuminator 254 is active, it may backlight the buttons on keypad 252 and stay on while the client computer is powered. Also, illuminator 254 may backlight these buttons in various patterns when particular actions are performed, such as dialing another client computer. Illuminator 254 may also cause light sources positioned within a transparent or translucent case of the client computer to illuminate in response to actions.

Further, client computer 200 may also comprise hardware security module (HSM) 268 for providing additional tamper resistant safeguards for generating, storing and/or using security/cryptographic information such as, keys, digital certificates, passwords, passphrases, two-factor authentication information, or the like. In some embodiments, hardware security module may be employed to support one or more standard public key infrastructures (PKI), and may be employed to generate, manage, and/or store keys pairs, or the like. In some embodiments, HSM 268 may be a stand-alone computer, in other cases, HSM 268 may be arranged as a hardware card that may be added to a client computer.

Client computer 200 may also comprise input/output interface 238 for communicating with external peripheral devices or other computers such as other client computers and network computers. The peripheral devices may include an audio headset, display screen glasses, remote speaker system, remote speaker and microphone system, and the like. Input/output interface 238 can utilize one or more technologies, such as Universal Serial Bus (USB), Infrared, WiFi, WiMax, Bluetooth™, and the like.

Input/output interface 238 may also include one or more sensors for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), or the like. Sensors may be one or more hardware sensors that collect and/or measure data that is external to client computer 200.

Haptic interface 264 may be arranged to provide tactile feedback to a user of the client computer. For example, the haptic interface 264 may be employed to vibrate client computer 200 in a particular way when another user of a computer is calling. Temperature interface 262 may be used to provide a temperature measurement input and/or a temperature changing output to a user of client computer 200. Open air gesture interface 260 may sense physical gestures of a user of client computer 200, for example, by using single or stereo video cameras, radar, a gyroscopic sensor inside a computer held or worn by the user, or the like. Camera 240 may be used to track physical eye movements of a user of client computer 200.

GPS transceiver 258 can determine the physical coordinates of client computer 200 on the surface of the Earth, which typically outputs a location as latitude and longitude values. GPS transceiver 258 can also employ other geo-positioning mechanisms, including, but not limited to, triangulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of client computer 200 on the surface of the Earth. It is understood that under different conditions, GPS transceiver 258 can determine a physical location for client computer 200. In at least one embodiment, however, client computer 200 may, through other components, provide other information that may be employed to determine a physical location of the client computer, including for example, a Media Access Control (MAC) address, IP address, and the like.

Human interface components can be peripheral devices that are physically separate from client computer 200, allowing for remote input and/or output to client computer 200. For example, information routed as described here through human interface components such as display 250 or keyboard 252 can instead be routed through network interface 232 to appropriate human interface components located remotely. Examples of human interface peripheral components that may be remote include, but are not limited to, audio devices, pointing devices, keypads, displays, cameras, projectors, and the like. These peripheral components may communicate over a Pico Network such as Bluetooth™, Zigbee™ and the like. One non-limiting example of a client computer with such peripheral human interface components is a wearable computer, which might include a remote pico projector along with one or more cameras that remotely communicate with a separately located client computer to sense a user's gestures toward portions of an image projected by the pico projector onto a reflected surface such as a wall or the user's hand.

A client computer may include web browser application 226 that is configured to receive and to send web pages, web-based messages, graphics, text, multimedia, and the like. The client computer's browser application may employ virtually any programming language, including a wireless application protocol messages (WAP), and the like. In at least one embodiment, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), HTML5, and the like.

Memory 204 may include RAM, ROM, and/or other types of memory. Memory 204 illustrates an example of computer-readable storage media (devices) for storage of information such as computer-readable instructions, data structures, program modules or other data. Memory 204 may store BIOS 208 for controlling low-level operation of client computer 200. The memory may also store operating system 206 for controlling the operation of client computer 200. It will be appreciated that this component may include a general-purpose operating system such as a version of UNIX, or LINUX™, or a specialized client computer communication operating system such as Windows Phone™, or the Symbian® operating system. The operating system may include, or interface with a Java virtual machine module that enables control of hardware components and/or operating system operations via Java application programs.

Memory 204 may further include one or more data storage 210, which can be utilized by client computer 200 to store, among other things, applications 220 and/or other data. For example, data storage 210 may also be employed to store information that describes various capabilities of client computer 200. The information may then be provided to another device or computer based on any of a variety of methods, including being sent as part of a header during a communication, sent upon request, or the like. Data storage 210 may also be employed to store social networking information including address books, buddy lists, aliases, user profile information, or the like. Data storage 210 may further include program code, data, algorithms, and the like, for use by a processor, such as processor 202 to execute and perform actions. In one embodiment, at least some of data storage 210 might also be stored on another component of client computer 200, including, but not limited to, non-transitory processor-readable removable storage device 236, processor-readable stationary storage device 234, or even external to the client computer.

Applications 220 may include computer executable instructions which, when executed by client computer 200, transmit, receive, and/or otherwise process instructions and data. Applications 220 may include, for example, operations management client application 222. In at least one of the various embodiments, operations management client application 222 may be used to exchange communications to and from operations management server computer 116, monitoring server computer 114, application server computer 112, or the like. Exchanged communications may include, but are not limited to, queries, searches, messages, notification messages, event messages, alerts, performance metrics, log data, API calls, or the like, combination thereof.

Other examples of application programs include calendars, search programs, email client applications, IM applications, SMS applications, Voice Over Internet Protocol (VOIP) applications, contact managers, task managers, transcoders, database programs, word processing programs, security applications, spreadsheet programs, games, search programs, and so forth.

Additionally, in one or more embodiments (not shown in the figures), client computer 200 may include an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. Also, in one or more embodiments (not shown in the figures), client computer 200 may include a hardware microcontroller instead of a CPU. In at least one embodiment, the microcontroller may directly execute its own embedded logic to perform actions and access its own internal memory and its own external Input and Output Interfaces (e.g., hardware pins and/or wireless transceivers) to perform actions, such as System On a Chip (SOC), or the like.

Illustrative Network Computer

FIG. 3 shows one embodiment of network computer 300 that may be included in a system implementing at least one of the various embodiments. Network computer 300 may include many more or less components than those shown in FIG. 3. However, the components shown are sufficient to disclose an illustrative embodiment for practicing these innovations. Network computer 300 may represent, for example, one embodiment of at least one of operations management server computer 116, monitoring server computer(s) 114, or application server computer(s) 112 of FIG. 1.

As shown in the figure, network computer 300 includes a processor 302 in communication with a memory 304 via a bus 328. Network computer 300 also includes a power supply 330, network interface 332, audio interface 356, display 350, keyboard 352, input/output interface 338, processor-readable stationary storage device 334, and processor-readable removable storage device 336. Power supply 330 provides power to network computer 300.

Network interface 332 includes circuitry for coupling network computer 300 to one or more networks, and is constructed for use with one or more communication protocols and technologies including, but not limited to, protocols and technologies that implement any portion of the Open Systems Interconnection model (OSI model), global system for mobile communication (GSM), code division multiple access (CDMA), time division multiple access (TDMA), user datagram protocol (UDP), transmission control protocol/Internet protocol (TCP/IP), Short Message Service (SMS), Multimedia Messaging Service (MMS), general packet radio service (GPRS), WAP, ultra wide band (UWB), IEEE 802.16 Worldwide Interoperability for Microwave Access (WiMax), Session Initiation Protocol/Real-time Transport Protocol (SIP/RTP), or any of a variety of other wired and wireless communication protocols. Network interface 332 is sometimes known as a transceiver, transceiving device, or network interface card (NIC). Network computer 300 may optionally communicate with a base station (not shown), or directly with another computer.

Audio interface 356 is arranged to produce and receive audio signals such as the sound of a human voice. For example, audio interface 356 may be coupled to a speaker and microphone (not shown) to enable telecommunication with others and/or generate an audio acknowledgement for some action. A microphone in audio interface 356 can also be used for input to or control of network computer 300, for example, using voice recognition.

Display 350 may be a liquid crystal display (LCD), gas plasma, electronic ink, light emitting diode (LED), Organic LED (OLED) or any other type of light reflective or light transmissive display that can be used with a computer. Display 350 may be a handheld projector or pico projector capable of projecting an image on a wall or other object.

Network computer 300 may also comprise input/output interface 338 for communicating with external devices or computers not shown in FIG. 3. Input/output interface 338 can utilize one or more wired or wireless communication technologies, such as USB™, Firewire™, WiFi, WiMax, Thunderbolt™, Infrared, Bluetooth™, Zigbee™, serial port, parallel port, and the like.

Also, input/output interface 338 may also include one or more sensors for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), or the like. Sensors may be one or more hardware sensors that collect and/or measure data that is external to network computer 300. Human interface components can be physically separate from network computer 300, allowing for remote input and/or output to network computer 300. For example, information routed as described here through human interface components such as display 350 or keyboard 352 can instead be routed through the network interface 332 to appropriate human interface components located elsewhere on the network. Human interface components include any component that allows the computer to take input from, or send output to, a human user of a computer. Accordingly, pointing devices such as mice, styluses, track balls, or the like, may communicate through pointing device interface 358 to receive user input.

GPS transceiver 340 can determine the physical coordinates of network computer 300 on the surface of the Earth, which typically outputs a location as latitude and longitude values. GPS transceiver 340 can also employ other geo-positioning mechanisms, including, but not limited to, triangulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of network computer 300 on the surface of the Earth. It is understood that under different conditions, GPS transceiver 340 can determine a physical location for network computer 300. In at least one embodiment, however, network computer 300 may, through other components, provide other information that may be employed to determine a physical location of the client computer, including for example, a Media Access Control (MAC) address, IP address, and the like.

Memory 304 may include Random Access Memory (RAM), Read-Only Memory (ROM), and/or other types of memory. Memory 304 illustrates an example of computer-readable storage media (devices) for storage of information such as computer-readable instructions, data structures, program modules or other data. Memory 304 stores a basic input/output system (BIOS) 308 for controlling low-level operation of network computer 300. The memory also stores an operating system 306 for controlling the operation of network computer 300. It will be appreciated that this component may include a general-purpose operating system such as a version of UNIX, or LINUX™, or a specialized operating system such as Microsoft Corporation's Windows® operating system, or the Apple Corporation's IOS® operating system. The operating system may include, or interface with a Java virtual machine module that enables control of hardware components and/or operating system operations via Java application programs. Likewise, other runtime environments may be included.

Memory 304 may further include one or more data storage 310, which can be utilized by network computer 300 to store, among other things, applications 320 and/or other data. For example, data storage 310 may also be employed to store information that describes various capabilities of network computer 300. The information may then be provided to another device or computer based on any of a variety of methods, including being sent as part of a header during a communication, sent upon request, or the like. Data storage 410 may also be employed to store social networking information including address books, buddy lists, aliases, user profile information, or the like. Data storage 310 may further include program code, instructions, data, algorithms, and the like, for use by a processor, such as processor 302 to execute and perform actions such as those actions described below. In one embodiment, at least some of data storage 310 might also be stored on another component of network computer 300, including, but not limited to, non-transitory media inside processor-readable removable storage device 336, processor-readable stationary storage device 334, or any other computer-readable storage device within network computer 300, or even external to network computer 300. Data storage 310 may include, for example, maturity models 312, operations metrics 314, operations events 316, or the like.

Applications 320 may include computer executable instructions which, when executed by network computer 300, transmit, receive, and/or otherwise process messages (e.g., SMS, Multimedia Messaging Service (MMS), Instant Message (IM), email, and/or other messages), audio, video, and enable telecommunication with another user of another mobile computer. Other examples of application programs include calendars, search programs, email client applications, IM applications, SMS applications, Voice Over Internet Protocol (VOIP) applications, contact managers, task managers, transcoders, database programs, word processing programs, security applications, spreadsheet programs, games, search programs, and so forth. Applications 320 may include operations metrics application 322, operations modeling application 324, resolution tracker 325 that perform actions further described below. In at least one of the various embodiments, one or more of the applications may be implemented as modules and/or components of another application. Further, in at least one of the various embodiments, applications may be implemented as operating system extensions, modules, plugins, or the like.

Furthermore, in at least one of the various embodiments, operations metrics application 322, operations modeling application 324, or the like, may be operative in a cloud-based computing environment. In at least one of the various embodiments, these applications, and others, that comprise the management platform may be executing within virtual machines and/or virtual servers that may be managed in a cloud-based based computing environment. In at least one of the various embodiments, in this context the applications may flow from one physical network computer within the cloud-based environment to another depending on performance and scaling considerations automatically managed by the cloud computing environment. Likewise, in at least one of the various embodiments, virtual machines and/or virtual servers dedicated to operations metrics application 322, operations modeling application 324, or resolution tracker 325 may be provisioned and de-commissioned automatically.

In at least one of the various embodiments, applications, such as, operations metrics application 322, operations modeling application 324, resolution tracker 325, web services application 326, other applications 328, or the like, may be arranged to employ geo-location information to select one or more localization features, such as, time zones, languages, currencies, calendar formatting, or the like. Localization features may be used in user-interfaces and well as internal processes and/or databases. In at least one of the various embodiments, geo-location information used for selecting localization information may be provided by GPS 340. Also, in some embodiments, geolocation information may include information providing using one or more geolocation protocol over the networks, such as, wireless network 108 and/or network 111.

Also, in at least one of the various embodiments, operations metrics application 322, operations modeling application 324, resolution tracker 325, or the like, may located in virtual servers running in a cloud-based computing environment rather than being tied to one or more specific physical network computers.

Further, network computer 300 may also comprise hardware security module (HSM) 360 for providing additional tamper resistant safeguards for generating, storing and/or using security/cryptographic information such as, keys, digital certificates, passwords, passphrases, two-factor authentication information, or the like. In some embodiments, hardware security module may be employ to support one or more standard public key infrastructures (PKI), and may be employed to generate, manage, and/or store keys pairs, or the like. In some embodiments, HSM 360 may be a stand-alone network computer, in other cases, HSM 360 may be arranged as a hardware card that may be installed in a network computer.

Additionally, in one or more embodiments (not shown in the figures), network computer 300 may include an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. Also, in one or more embodiments (not shown in the figures), the network computer may include a hardware microcontroller instead of a CPU. In at least one embodiment, the microcontroller may directly execute its own embedded logic to perform actions and access its own internal memory and its own external Input and Output Interfaces (e.g., hardware pins and/or wireless transceivers) to perform actions, such as System On a Chip (SOC), or the like.

Illustrative Logical System Architecture

Figure 4:
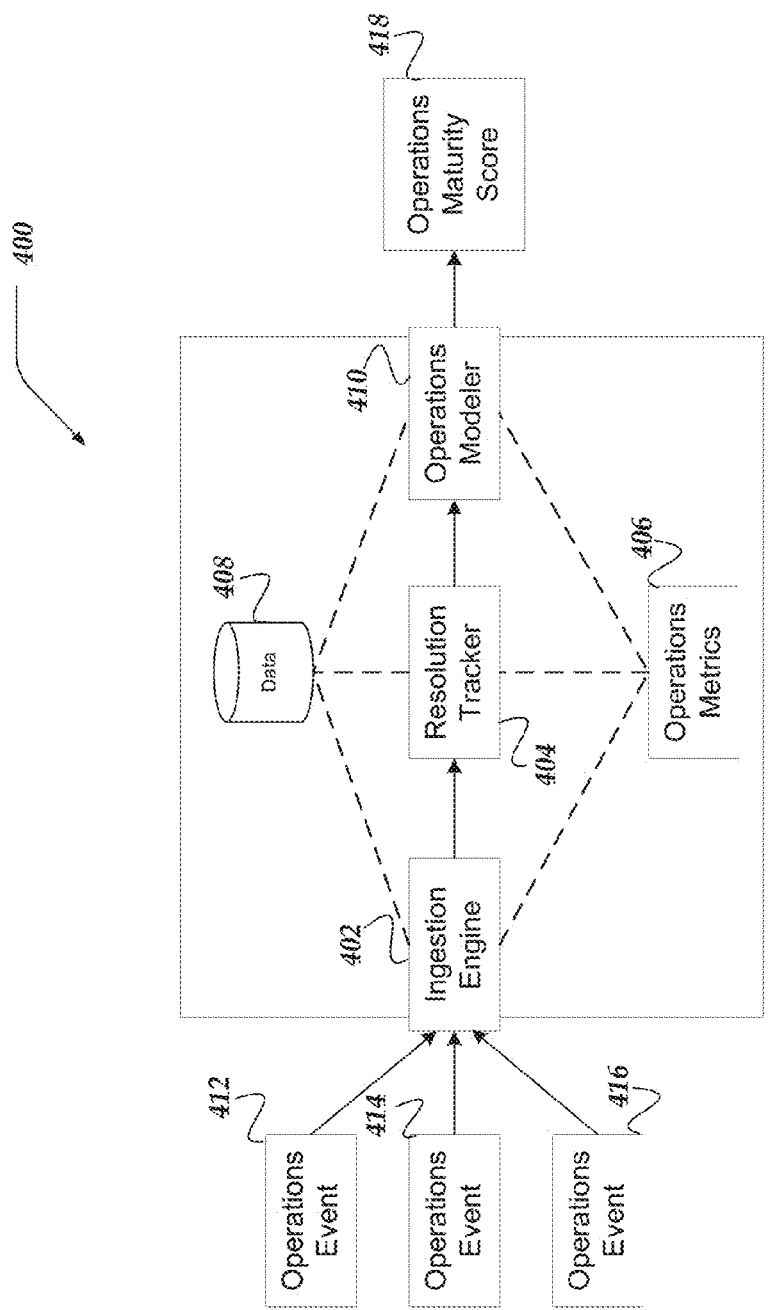
FIG. 4 illustrates a logical architecture of an operations management system that provides operations maturity modeling in accordance with at least one of the various embodiments.

FIG. 4 illustrates a logical architecture of operations management system 400 that provides operations maturity modeling in accordance with at least one of the various embodiments. In at least one of the various embodiments, a system for providing operational maturity models for entities or enterprises may comprise various components. In this example, operations management system 400 includes, ingestion engine 402, resolution tracker 404, operations metrics 406, database 408, operations modeler 410, and so on.

In at least one of the various embodiments, an ingestion engine such as ingestion engine 402 may be arranged to receive and/or obtain one or more different types of operations events, here represented by operations event 412, operations event 414, and operations event 416. In at least one of the various embodiments, operations events may be variously formatted messages that reflect the occurrence of events and/or incidents that have occurred in an organizations computing system. Such events may include alerts regarding system errors, warning, failure reports, customer service requests, or the like. Operations event may be collected by one or more external services and provided to operations management system 400. Operations events, as described above may be comprised of SMS messages, HTTP requests/posts, API calls, log file entries, trouble tickets, emails, or the like. In at least one of the various embodiments, operations events may be associated with time stamp information and/or status indicators that can track when the operations event/incident is reported and/or occurs. Also, in some embodiments, operation events, may be also be associated with one or more service teams the may be responsible for resolving the issues related to the operations events.

Accordingly, ingestion engine 402 may be arranged to receive the various operations events and performs various actions, including, filtering, reformatting, information extraction, data normalizing, or the like, or combination thereof, to enable the operations events to be stored and processed. In at least one of the various embodiments, operation events may be stored in databased 408.

In at least one of the various embodiments, operations events may be provided by one or more organizations. In some embodiments, there may be several organization (e.g., 100's, 1000's, or the like) that provide operations events to the system. Operations events from different organizations may be segregated from each other so that an organization may only interact with events that are owned by it. However, operations management system 400 may be arranged to have visibility to all of the operations events to enable community wide analysis to be performed.

In at least one of the various embodiments, resolution tracker 404 may be arranged to monitor the details regarding how the operations events are resolved. In some embodiments, this may include tracking the times related to the operation events, the resources that are/were responsible for resolving the events, and so on. Likewise, operations metrics 406 may arranged to record the metrics related to the resolution of the operations events. For example, operations metrics 406 may be arranged to compute various metrics, such as, mean-time-to-acknowledge (MTTA), mean-time-to-resolve (MTTR), incident count per resolvers, resolution escalations, uniqueness of events, auto-resolve rate, time-of-day of incidents, adjusting for multiple events per single incident, or the like, or combination thereof. Also, in at least one of the various embodiments, computed metrics may include time-to-discovery, time-to-acknowledgement, time-to-resolution, or transformations of these metrics, such as, mean, median, percentile, or the like. Further, one of ordinary skill in the art will appreciate that there are other relevant metrics that may be generated, measured, or collected. It is in the interest of clarity and brevity that the descriptions of additional metrics are omitted.

In at least one of the various embodiments, operations management system 400 may include various user-interfaces and/or configuration information that enable organizations to establish how operations events should be resolved. (Not shown in FIG. 4) Accordingly, an organization may define, rules, conditions, priority levels, notification rules, escalation rules, or the like, or combination thereof, that may be associated with different types of operations events. For example, some operations events may be informational rather than associated with a critical failure. Accordingly, an organization may setup different rules and/or other handling mechanics for the different types of events. Critical events may require immediate notification of a response user to resolve the underlying cause of the event. In other cases, the operations events may simply be recorded for future analysis.

In at least one of the various embodiments, operations modeler 410 may be arranged to use the various metrics associated with operations events, incidents, resolution of events, and so on, to produce one or more models that reflect the operational maturity of the organization. In at least one of the various embodiments, operations modeler 410 may be used to generate one or more operational models from one or more organizations that may be managed by operations management system 400. Models for individual organizations may be provided as well as models for the community of organization and/or sub-sections of the community.

In at least one of the various embodiments, operations modeler 410 may be arranged to provide an operations maturity score that embodies one or more sub-scores. In at least one of the various embodiments, the operations maturity score may enable an organization to evaluate how well its operations, such as, computing operations compare to other organizations. The sub-scores may enable an organization to observe how different areas of its operations compare as well.

Furthermore, in at least one of the various embodiments, client computer 200 or network computer 300 is arranged to include one or more sensors for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), or the like.

For example, in at least one embodiment, geolocation information (such as latitude and longitude coordinates, or the like) is collected by a hardware GPS sensor and subsequently employed in the computing of sub-scores, sub-score weights, or the like. Similarly, in at least one embodiment, weather information (such as temperature, atmospheric pressure, wind speed, humidity, or the like) is collected by a hardware weather sensor and subsequently employed in the computing of sub-scores, sub-score weights, or the like. Additionally, in at least one embodiment, electrical power information (such as voltage, current, frequency, or the like) is collected by a hardware electrical power sensor and subsequently employed in the computing of sub-scores, sub-score weights, or the like. Also operations events may be modified to include geolocation and/or sensor information. Accordingly, sub-score may be categorized and/or compared across different conditions and/or locations. For example, hot and cold weather extremes may be impact the values of one or more sub-scores. Likewise, in at least one of the various embodiments, the operations management system is arranged to determine one or more localization features based on the geolocation information collected from its GPS systems, sensors, network, network interface, or the like, or combination thereof.

Also, in at least one of the various embodiments, sensing geolocation information provided by one or more geolocation devices is employed to perform one or more actions, such as: providing a modification of the one or more sub-scores based at least on the sensed information; or localizing the one or more recommendations based at least on the sensed information.

FIG. 5 illustrates table 500 that includes a portion of the metrics that may be generated for providing operational maturity model scores, in accordance with at least one of the various embodiments. In at least one of the various embodiments, table 500 may be data structure employed by an operations modelling application to generate operations models. One of ordinary skill in the art will appreciate that the actual data structure for table 500 may vary. Also, there may be more or fewer columns. Also, more or fewer sub-scores may be included in the data structure as well without departing from the scope of these innovations.

In at least one of the various embodiments, table 500 may include various columns, such as: column 502 that describes the name of the score; column 504 that indicates the scale being used for the sub-score; column 506 for the raw 1% percentile score for the sub-score (e.g., the worst 1% of the organization in the community), column 508 for the raw 99% percentile score for the sub-score (e.g., 99% of organization have a lower score); 1% percentile scaled value; 99% percentile scaled value; and percentage of contribution to the total score for the sub-score.

In at least one of the various embodiments, table 500 includes several sub-scores 516. In at least one of the various embodiments, mean-time-to-acknowledge (MTTA) sub-score may be the average time it takes for an organization's first responder to acknowledge each event/incident. In some embodiments, incidents that were never acknowledged are not included in this average.

In at least one of the various embodiments, mean-time-to-resolve (MTTR) sub-score may be the average time it takes to resolve each event/incident. In some embodiments, incidents that were never resolved are not included in this average.

In at least one of the various embodiments, incidents/resolver ratio sub-score may be a measurement of an organization's incidents to resolver ratio. In some embodiments, the incident/resolver ratio may be computed over a defined window of time. For example, an incidents per 30 days per resolver may be the number of incidents the organization received in a 30-day period, divided by the total number of people who have resolved at least one incident. If an organization provides data that is less than or exceeds the defined time windows (e.g., in this example, more or less than 30 days' worth of data) the metric may be scaled appropriately to the time window to provide an estimate.

In at least one of the various embodiments, escalation score sub-score may be arranged to measure the number of escalation incidents that occur for an organization, with a penalty for incidents that were escalated due to timeout. For example, each time an incident is escalated due to timeout, add two 'points' and each time an incident is manually escalated by a responder, add one 'point.' Accordingly, in at least one of the various embodiments, the final escalation score is the total number of points divided by an organizations total number of events/incidents.

In at least one of the various embodiments, an escalation may be passing the responsibility for resolving an operations event to another responsible party/team. Operations management system may enable organization to define escalation rules that may be associated with the various systems and/or operations events that may occur.

In at least one of the various embodiments, assignments per incident sub-score may be the total number of times incidents were assigned to an organization personnel divided by the number of incidents. In some embodiments, this may be similar to an organization's escalation score but it also captures times if a single incident may be assigned to multiple people.

In at least one of the various embodiments, timeout auto-resolve rate sub-score may be the percentage of incidents that were automatically resolved by the system because they were not resolved by a user or other external monitoring tool. In at least one of the various embodiments, this may imply that these high-urgency incidents were not effectively resolved and thus it may be best to have a low auto-resolve rate.

In at least one of the various embodiments, uniqueness score sub-score may be the total number of distinct incident descriptions—with numbers removed—divided by the total number of incidents. For example, 'CPU load on host01 at 95%' and 'CPU load on host02 at 97%' count as one distinct incident because they are parsed as 'CPU load on host at %'. In at least one of the various embodiments, sub-score may be computer and/or calibrated for a defined time windows, such as, 30 days of input data.

Accordingly, in at least one of the various embodiments, an organization's operational maturity score may be a single value, such as a value from 1-10, that is generated based the values for its sub-scores. Each organization may have its own operational maturity score, enabling realistic comparison among the different organizations.

In at least one of the various embodiments, other sub-scores may be included, such as, one or more sub-scores that represent the severity of incidents, where high severity incidents while fewer in number may have a greater impact on an organization's operational maturity score. Also, in at least one of the various embodiments, sub-scores may be introduced that account for if multiple incidents may be reported for the same event. In some embodiments, an organization may employ multiple/redundant monitoring services that each may provide an operations events for the same event, or events that are related to the same incidents. For example, in at least one of the various embodiments, if a system unexpectedly goes offline, it may cause several subsystems to generate operations events. Accordingly, since all of these events spring from the same root cause incident (e.g., the database going down) the sub-score may be modified to account for this.

In at least one of the various embodiments, sub-scores may be defined to account for incidents that be associated with occurrence of particular operation activities. Accordingly, in some embodiments, incidents that occur during or near the deployment of new versions of applications/services. In this example, a low percentile sub-score may indicate that the organizations deployment procedures are not as good as they could. Or, perhaps, the organization's pre-deployment testing (quality assurance) may a candidate for improvement.

In at least one of the various embodiments, from time-to-time the particular sub-scores that are selected be part of an operational maturity score may be modified. Also, the methods for computing a given sub scores may also be modified. Accordingly, in at least one of the various embodiments, operational maturity scores (and the sub-scores) may be versioned to help ensure that if operation maturity score are compared (either for the same organization or between organizations) the same versions may be used.

Furthermore, in at least one of the various embodiments, some sub-scores may include various computed metrics, such as, time-to-discovery, time-to-acknowledgement, time-to-resolution, or transformations of these metrics, such as, mean, median, percentile, or the like. Further, one of ordinary skill in the art will appreciate that there are other relevant metrics that may be generated, measured, or collected for incorporation into one or more sub-scores. It is in the interest of clarity and brevity that the description of additional metrics are omitted.

Figure 6:
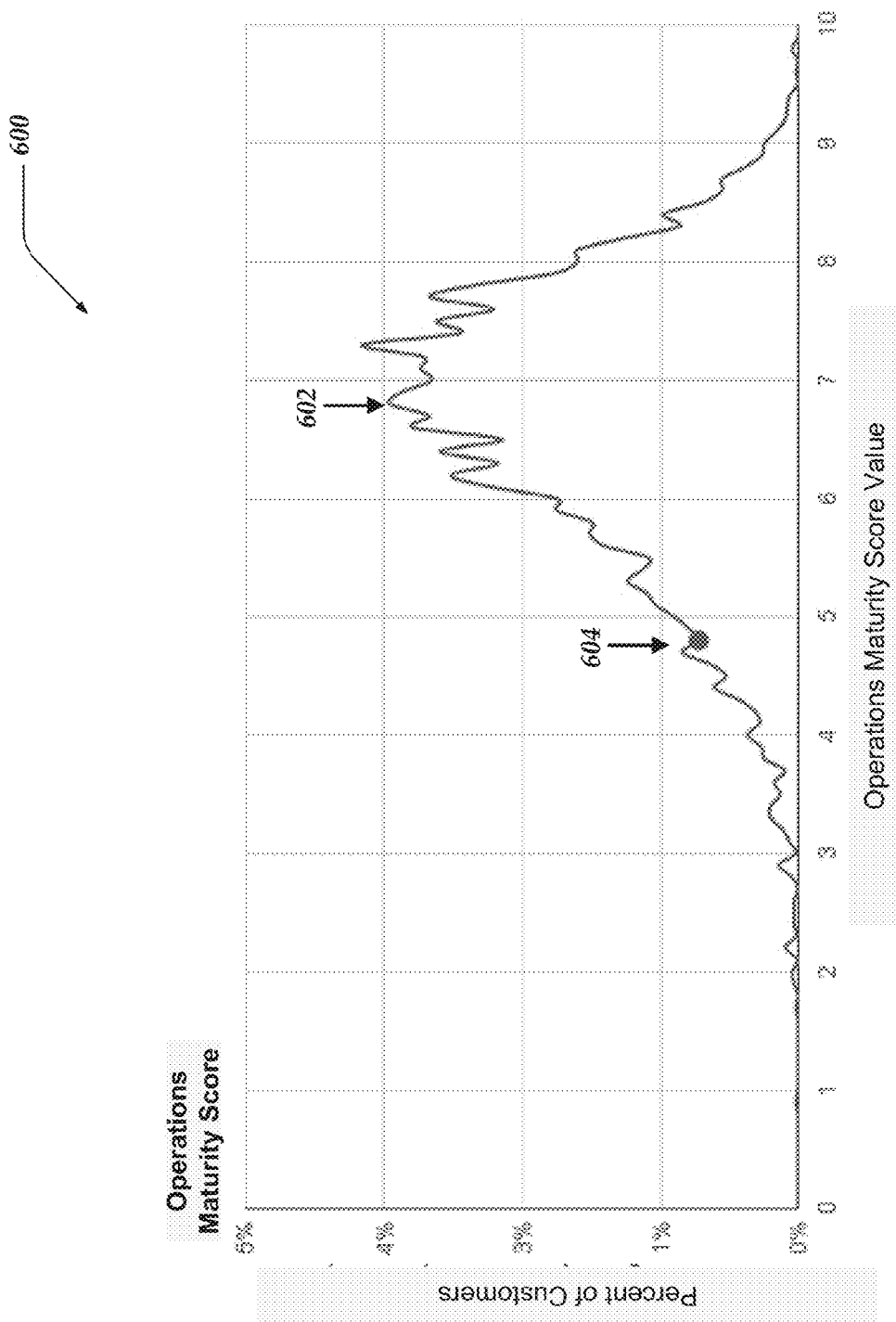
FIG. 6 illustrates a graph that is an example of a plot of operations maturity score for a community of organizations in accordance with at least one of the various embodiments.

FIG. 6 illustrates graph 600 that is an example of a plot of operations maturity score for a community of organizations in accordance with at least one of the various embodiments. In this example, graph 600 plots the operations maturity score value against the number of modeled organizations (in terms of percentage). In this example, curve 602 represents a scaled plot of the operations maturity scores for all of the organizations that are providing operations events to the system. Likewise, point 604 represents one organization's operations maturity value.

In at least one of the various embodiments, as described above, an operations management system may be arranged to manage several organizations. These organizations may be considered the community of organizations that are managed by the operations management system. Accordingly, sub-scores for the community may be generated by analyzing the operational data of the separate organizations in the community.

Figure 7:
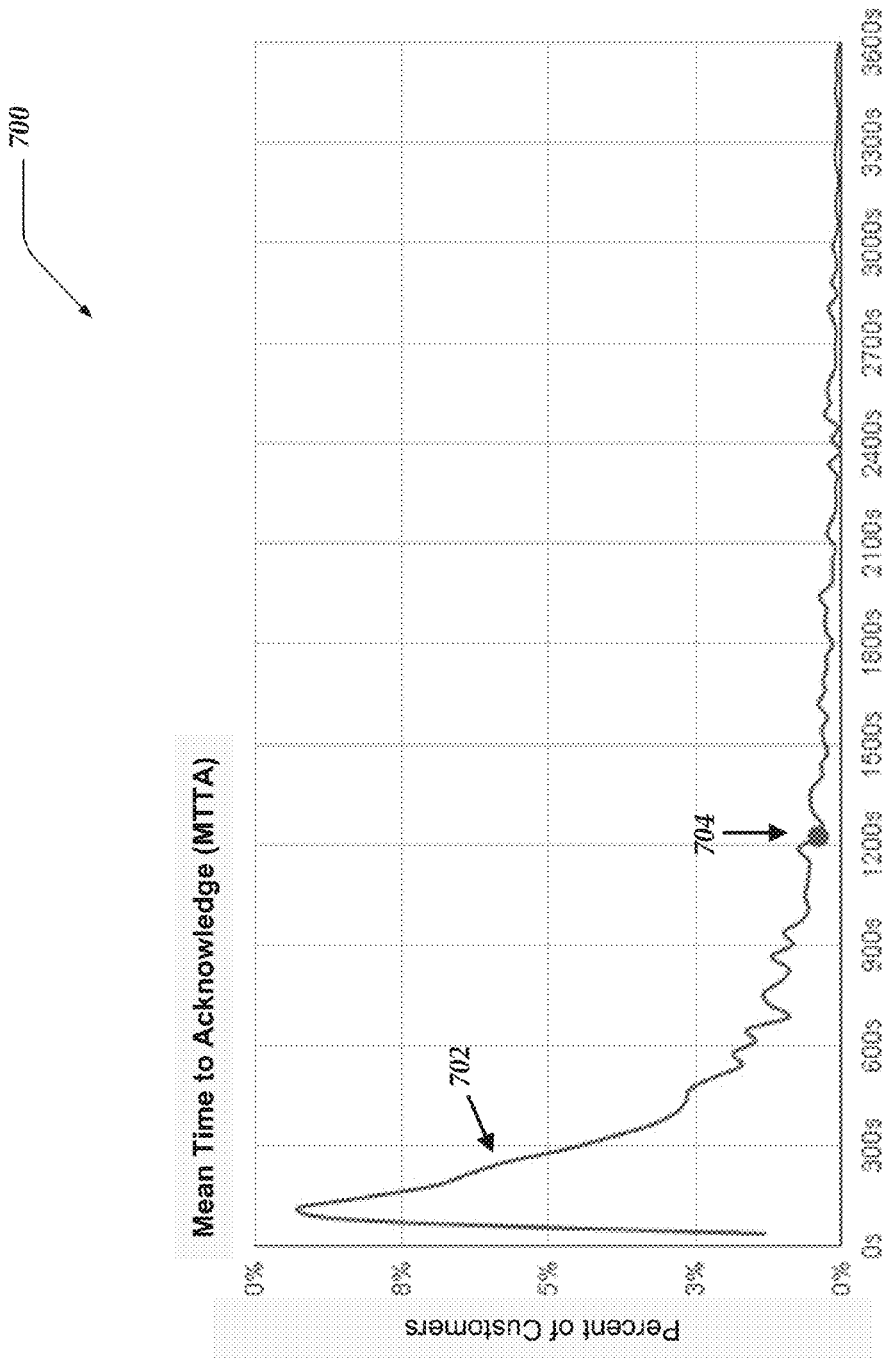
FIG. 7 illustrates a graph that is an example of a plot of sub-score values for organizations in accordance with at least one of the various embodiments.

FIG. 7 illustrates graph 700 that is an example of a plot of sub-score values for organizations in accordance with at least one of the various embodiments. In this example, graph 700 plots the mean-time-to-acknowledge (MTTA) in seconds against the number of modeled organizations (in terms of percentage). In this example, curve 702 represents a scaled plot of the MTTA values for all of the organizations that are providing operations events to the system. Likewise, point 704 represents one organization's MTTA value.

In addition to graphs such as FIGS. 6-7, additional graphs/reports/displays (not shown) may be provided that display one or more comparisons in terms of broad industry trends, percentiles, and histograms for both the aggregate and sub-scores of organizations and/or parts of organizations.

Generalized Operations

FIGS. 8-12 represent the generalized operations for operational maturity modeling in accordance with at least one of the various embodiments. In at least one of the various embodiments, processes 800, 900, 1000, 1100, and 1200 described in conjunction with FIGS. 8-12 may be implemented by and/or executed on a operations management server computer, a network computer, or the like, such as, network computer 300 of FIG. 3. In other embodiments, these processes, or portions thereof, may be implemented by and/or executed on a plurality of network computers, such as network computer 300 of FIG. 3. In yet other embodiments, these processes, or portions thereof, may be implemented by and/or executed on one or more virtualized computers, such as, those in a cloud-based environment. However, embodiments are not so limited and various combinations of network computers, client computers, or the like may be utilized. Further, in at least one of the various embodiments, the processes described in conjunction with FIGS. 8-12 may be used for providing operations maturity models in accordance with at least one of the various embodiments and/or architectures such as those described in conjunction with FIGS. 4-7. Further, in at least one of the various embodiments, some or all of the actions performed by processes 800, 900, 1000, 1100, and 1200 may be executed in part by operations metrics application 322, operations modeling application 324, resolution tracker application 325, or the like, or combination thereof.

Figure 8:
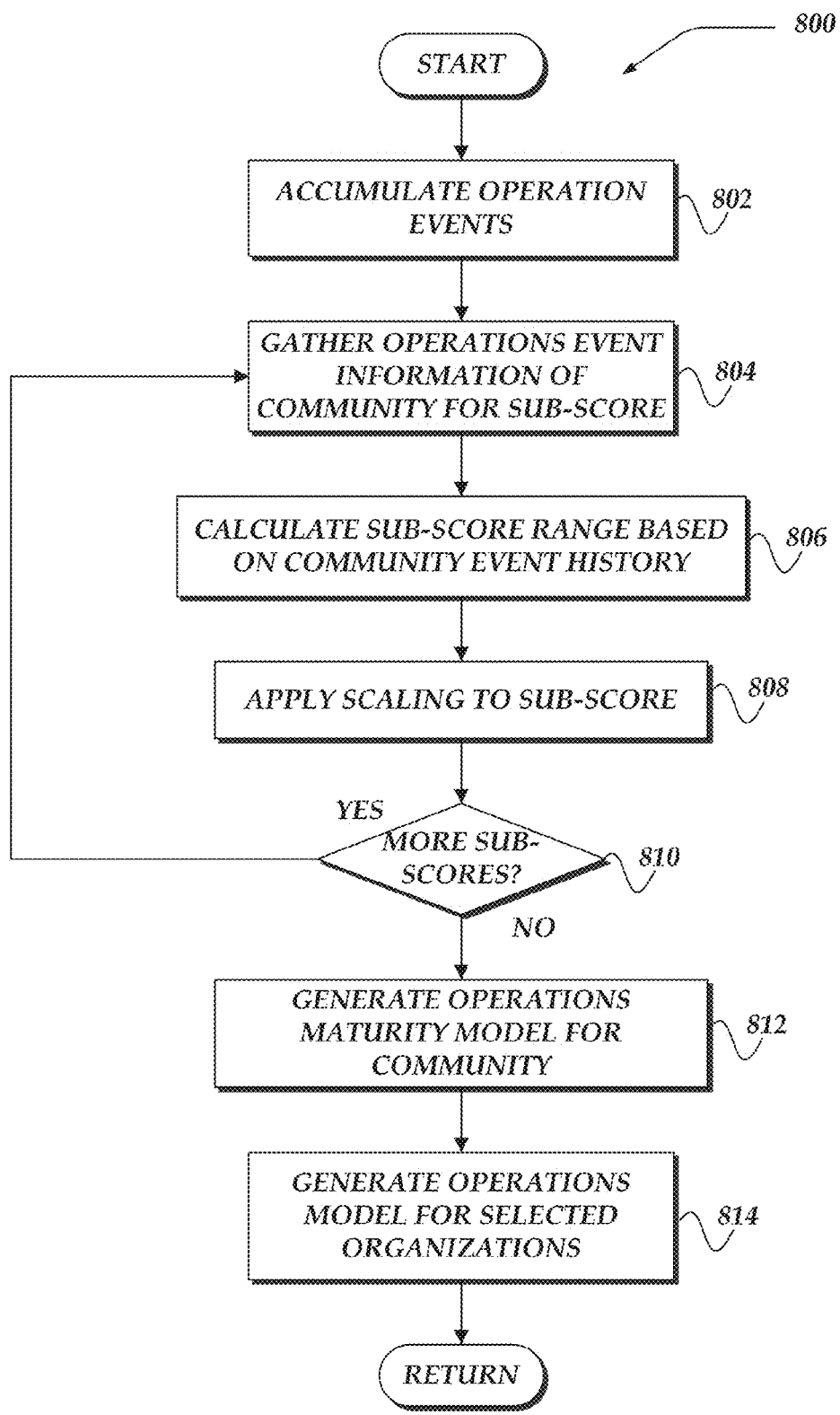
FIG. 8 illustrates an overview flowchart for a process for operational maturity modeling in accordance with at least one the various embodiments.

FIG. 8 illustrates an overview flowchart for process 800 for operational maturity modeling in accordance with at least one the various embodiments. After a start block, at block 802, in at least one of the various embodiments, operation events for multiple organizations may be accumulated. In at least one of the various embodiments, each organization may be configured to provide the same or different types of operations events. The particular types and/or format of the operations events may depend on the type of organization. However, in most cases, operations events may comprise description information, time stamps, source, destination, severity, status, or the like, or combination thereof.

In at least one of the various embodiments, raw operations events may be parsed and/or processed by the operations management system so features, such as, timestamps, status, source, severity or the like may be determined. In at least one of the various embodiments, raw operations events may be converted into operations events that are compatible for tracking in the operations management system. For example, an organization may be configured to provide email based raw operations events to report various incidents. Accordingly, in this example, the operations management system may be arranged to have an email "inbox" that can accept emailed event information. Thus, if an email event is received the operations management system may scan the email contents and generate one or more operations events that conform to the internal standards of the operations management system.

In at least one of the various embodiments, operations events may be associated with specific groups, teams, department with the same organization. Also, operations events may be associated with particular processes of the organizations. Accordingly, in at least one of the various embodiments, the operations management system may be arranged to operations events at an arbitrary granularity. Thus, the tracking granularity is not limited to the organization as a whole.

In at least one of the various embodiments, these additional detailed associations enable the operations management system perform data mining based comparisons that may be used to compare operations maturity information for different aspects of organizations within the same organization as well against other organization.

In at least one of the various embodiments, configuration information may be defined that associates one or more operations events with particular parts of an organization. Also, this configuration information may be defined to associate particular operations events to particular projects, tasks, teams, groups, customers, locations, or the like, or combination thereof. In at least one of the various embodiments, the configuration information may include rules/instructions that may be written in one or more programming languages. Further, in at least one of the various embodiments, configuration information may include pattern matching information (e.g., regular expressions) that may be used to determine the associations for operations events.

At block 804, in at least one of the various embodiments, operations event information for sub-scores may be gathered from the community of organizations that have provided operations events. In at least one of the various embodiments, before a sub-score may be provided, the metrics associated with the operations events must be collected. These metrics may be pulled from databases that store the operations events and/or information regarding how operations events were handled for a given organization. Accordingly, in at least one of the various embodiments, operations metrics application 322, or the like, may be arranged to retrieve the operations events from a database or other storage system for further processing.

Likewise, metrics may include, mean-time-to-acknowledge (MTTA), mean-time-to-resolve (MTTR), incident count per resolvers, resolution escalations, uniqueness of events, auto-resolve rate, time-of-day of incidents, adjusting for multiple events per single incident, or the like, or combination thereof. Also, in at least one of the various embodiments, metrics may include time-to-discovery, time-to-acknowledgement, time-to-resolution, or transformations of these metrics, such as, mean, median, percentile, or the like. Further, one of ordinary skill in the art will appreciate that there are other relevant metrics that may be generated, measured, or collected. It is in the interest of clarity and brevity that the descriptions of additional metrics are omitted.

At block 806, in at least one of the various embodiments, the sub-score ranges may be computed based on the operations events that may be associated with the organizations in the community. In at least one of the various embodiments, depending on the sub-score, there may be additional criteria that may be used to determine if an organizations event information may be used as part of determining the range of values. For example, for some sub-scores, there may be a minimum threshold number of events that must be seen for an organization to include the organization event historical into the range determination. Accordingly, in at least one of the various embodiments, configuration information may be provided that defined one or more conditions, constraints, or the like, that must be satisfied.

At block 808, in at least one of the various embodiments, the raw sub-score value for the sub-score may be scaled. As described above, operations metrics application 322 may be arranged to scale each sub-score. The scaling may be based on various functions, such as, log, linear, exponential, square-root, dummy-variable based on a threshold, or the like. The particular type of scaling for a given sub-score may be determined from configuration information, or one or more rule based-policies.

At decision block 810, in at least one of the various embodiments, if there are more sub-scores to process, control may loop back to block 804; otherwise, control may flow to block 812.

In at least one of the various embodiments, there may be several different sub-scores that each contribute to the operations maturity score for an organization. See, FIG. 5. Accordingly, operations events for each sub-scores may be processed.

At block 812, in at least one of the various embodiments, since all of the sub-scores have been processed and scaled, they may be used to generate an operational maturity model for the organizations that may be managed by the operations management system.

At block 814, in at least one of the various embodiments, operation maturity models may be generated for one or more selected organizations. Accordingly, in at least one of the various embodiments, the sub-scores and operational maturity score for the selected organizations may be generated. Next, control may be returned to a calling process.

Figure 9:
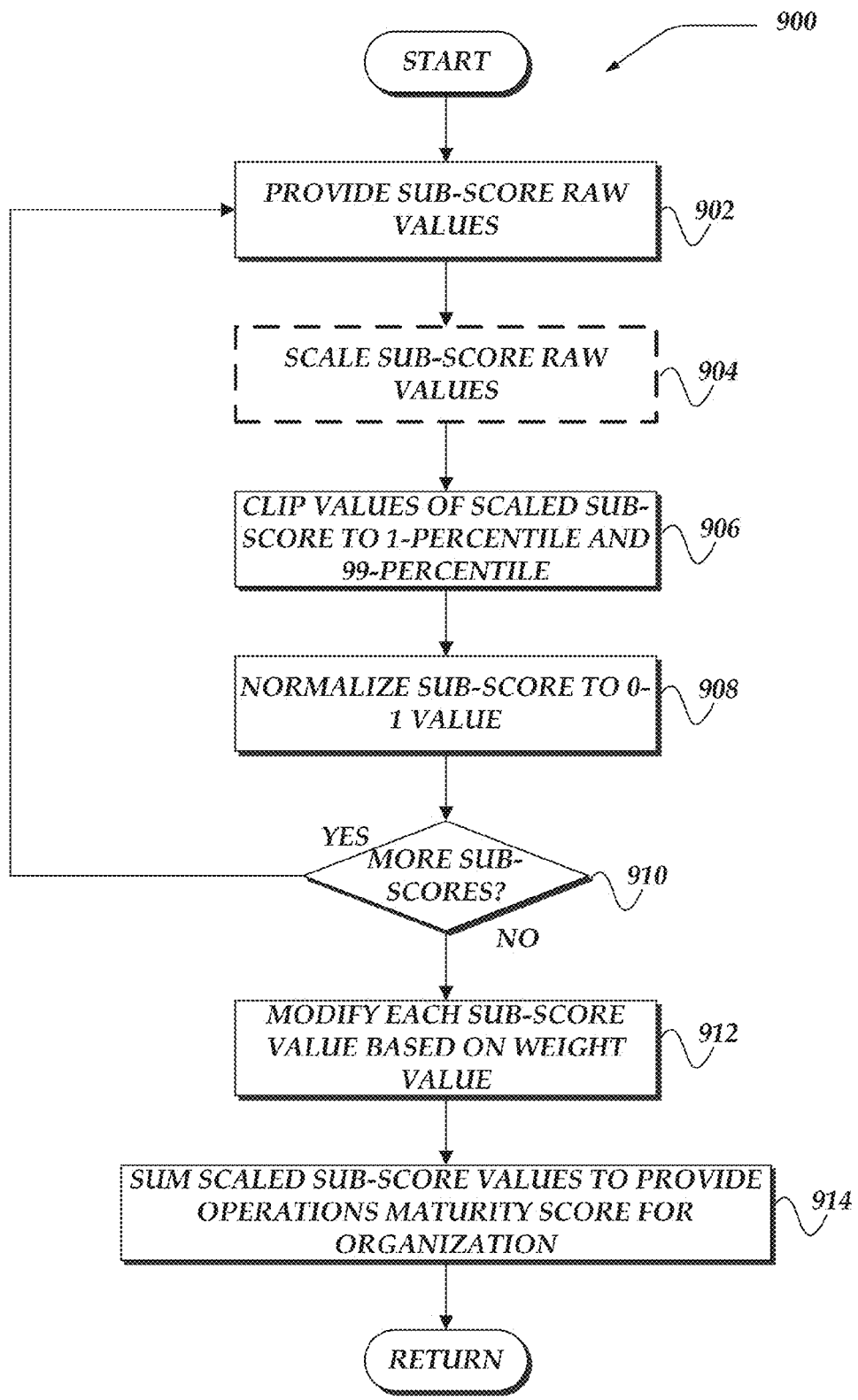
FIG. 9 illustrates a flowchart for a process for generating an operations maturity score for an organization in accordance with at least one of the various embodiments.

FIG. 9 illustrates a flowchart for process 900 for generating an operations maturity score for an organization in accordance with at least one of the various embodiments. After a start block, at block 902, in at least one of the various embodiments, raw sub-score values for the organization may be provided to process 900. In at least one of the various embodiments, raw scores may be collected from a database of operations events, resolution tracking data, and/or incidents that correspond to the organization.

At block 904, in at least one of the various embodiments, optionally, the raw sub-score values may be scaled. In at least one of the various embodiments, sub-scores may be scaled to accurately reflect how incremental improvements in an organization may contribute to the overall operations maturity of the organization. For example, a log scale provides the worst-performing organizations small gains if the improve their metrics increases from terrible to slightly less than terrible. Likewise, a log scale enables top performing organizations to see higher gains in their score if they make incremental improvements to their already high scores. In at least one of the various embodiments, this block may be optional since some sub-scores may not require scaling.

The scaling may be based on various functions, such as, log, linear, exponential, square-root, dummy-variable based on a threshold, or the like. The particular type of scaling for a given sub-score may be determined from configuration information, or one or more rule based-policies.

At block 906, in at least one of the various embodiments, the scaled sub-scores may be clipped to a lowest value (e.g., the 1-percentile value) and a highest value. For example, a lowest value maybe the 1-percentile value and the highest value may be the 99-percentile given a distribution of a sub-score values for a particular sub-score. Accordingly, if the scaled sub-score value is less than the lowest allowed value for the community of organizations, it is set to the lowest allowed value. Likewise, if the scaled sub-score exceeds the highest allowed value it may be set to the highest allowed value.

At block 908, in at least one of the various embodiments, the scaled sub-score value may be normalized to a value between 0 and 1. For example, in at least one of the various embodiments, the 1-percentile value for the sub-score may be subtracted from the scaled sub-score and then divided by the range of values for the sub-score. In some embodiments, the scaled sub-score may be normalized to a range other than 0 to 1.

At decision block 910, in at least one of the various embodiments, if there are more sub-scores for the organization, control may loop back to block 902; otherwise, control may flow to block 912. As discussed above, the operations maturity model for an organization and/or the community as a whole, may comprise several different sub-scores that attempt to capture different aspects of operational maturity.

At block 912, in at least one of the various embodiments, each sub-score for the organization may be modified based on a weighting value. In at least one of the various embodiments, the weight value reflects the importance the sub-score in representing the operational maturity of an organization. For example, referring to FIG. 5, in this example, MTTA is configured to contribute 20% to the overall operations maturity score. Accordingly in this example, the sub-score value for MTTA may be multiplied by 0.2 to weight it appropriately.

At block 914, in at least one of the various embodiments, the operations maturity score for the organization may be generated by adding the modified/weights sub-score values into a single value. As describe above, the operations maturity score may be a single value that represents an understanding the operational maturity of an organization. Also, in at least one of the various embodiments, the operations maturity score for an organization may be scored with a version number. Next, control may be returned to a calling process.

Figure 10:
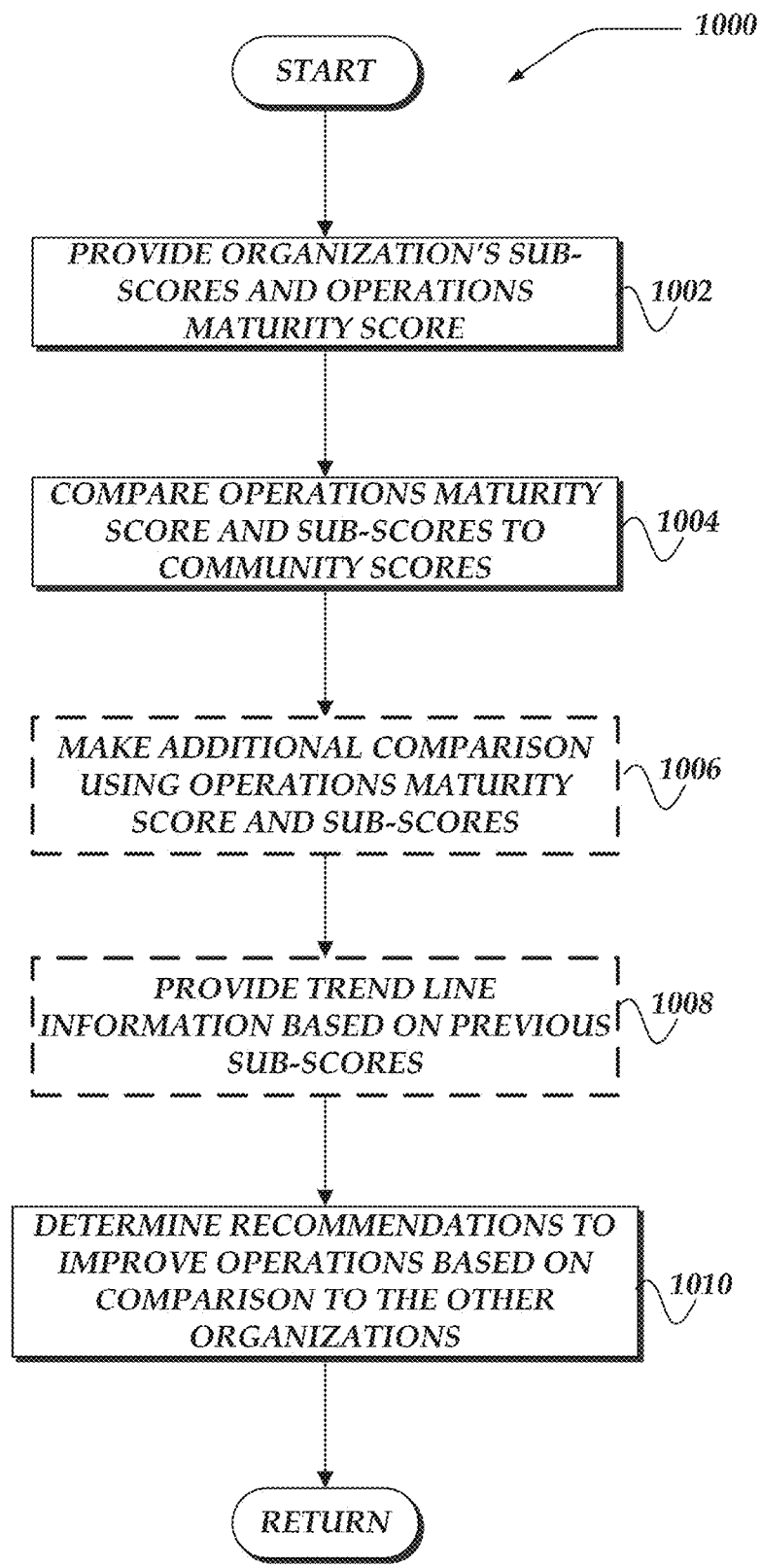
FIG. 10 illustrates a flowchart for a process for generating report information based on operations maturity scores and sub-score for an organization in accordance with at least one of the various embodiments.

FIG. 10 illustrates a flowchart for process 1000 for generating report information based on operations maturity scores and sub-scores for an organization in accordance with at least one of the various embodiments. After a start block, at block 1002, in at least one of the various embodiments, an organization's operations maturity score and its sub-scores may be provided. The values for these scores may be produced as discussed above.

At block 1004, in at least one of the various embodiments, the operations maturity score and sub-scores of the organization may be compared to the operations maturity scores and/or sub-scores of the other organizations in the community. In at least one of the various embodiments, the scores of the organizations that may be the subject of the report may be compared to the entire community of organizations.

At block 1006, in at least one of the various embodiments, optionally, the operations maturity score and/or the sub-scores of the organization that is the subject of the report may be used for one or more additional comparison. In at least one of the various embodiments, the scores may be used to compare a variety of different dimensions of operations maturity. In at least one of the various embodiments, various types of comparisons may be generated from data-mining the scores for the organizations that are being managed. A few examples are listed below, but one of ordinary skill in the art will appreciate an operations management system may perform other comparision as well. In at least one of the various embodiments, the operations modelling application may process the operations events using various techniques (e.g., data mining, informatics, machine learning, or the like) to identify and perform relevant comparisons.

In at least one of the various embodiments, the scores may be compared to the scores of other organizations that may be in the same or similar categories. In at least one of the various embodiments, comparing organizations that are members of the same or similar categories may produce meaningful apples-to-apples comparisons. Accordingly, the organizations that may be categorized using a variety of criteria, such as, company size, industry, geographic location, number of employees, or the like. Also, in at least one of the various embodiments, other criteria may include the number and/or types of operations events that collected the organizations.

In at least one of the various embodiments, accordingly, sub-scores may be generated based events associates with organizations that are in the same category or otherwise meet a defined criteria. For example, there may be a MTTA for banks, MTTA for hospitals, MTTA for universities, and so on.

Also, in at least one of the various embodiments, the scores may be used to track an organizations operations maturity over time. In such cases, the comparison may be made between previous scores of the same organization. The comparison may be used to determine if the organizations is getting better or worse, in terms of operation maturity.

Also, in at least one of the various embodiments, the operations maturity score and/or the sub-scores of the organization may be used to compare different departments, groups, teams, or the like, within the same organization. Accordingly, the comparisons may be used identify one or more departments, groups, teams, or the like, that are operating below average or above average.

In at least one of the various embodiments, comparisons may be made to identify performance difference that may exist between different development/software engineering management frameworks, such as, Agile, ITIL, DevOps, waterfall, or the like. Accordingly, an organization can track how different management frameworks affect their operations maturity. This type of comparision may be made between different organizations as well as different team/groups within the same organization. At block 1008, in at least one of the various embodiments, optionally, previous sub-score values may be used to generate one or more trend lines that may be used for illustrating trends and/or predictions for one or more sub-scores. In at least one of the various embodiments, various parameters may be set using a user-interface or configuration information to control the time windows, curve type, and so on, used to generate the trend lines. In some embodiments, the running averages may also be provided for display and/or included in report information.

At block 1010, in at least one of the various embodiments, one or more recommendations to improve the operations maturity score and/or the sub-scores for an organization may be determined based on the comparisons to the other organizations in the community. In at least one of the various embodiments, the recommendations may be included in a report describing the operations maturity score, sub-scores, and so on for an organization. Likewise, in at least one of the various embodiments, one or more recommendations to improve the operations maturity of the organization may be provided based on the comparisons to the other organizations in the community. Next, control may be returned to a calling process.

Also, in at least one of the various embodiments, since the operations maturity score and/or the sub-scores of the organization may be used to compare different departments, groups, teams, or the like, within the same organization. Accordingly, the comparisons may be used identify one or more departments, groups, teams, or the like, that are operating below average or above average.

In at least one of the various embodiments, comparisons may be made to identify performance differences that may exist between different development/software engineering management frameworks, such as, Agile, ITIL, DevOps, waterfall, or the like. Accordingly, an organization can track how different management frameworks affect their operations maturity. This type of comparision may be made between different organizations as well as different team/groups within the same organization.

Figure 11:
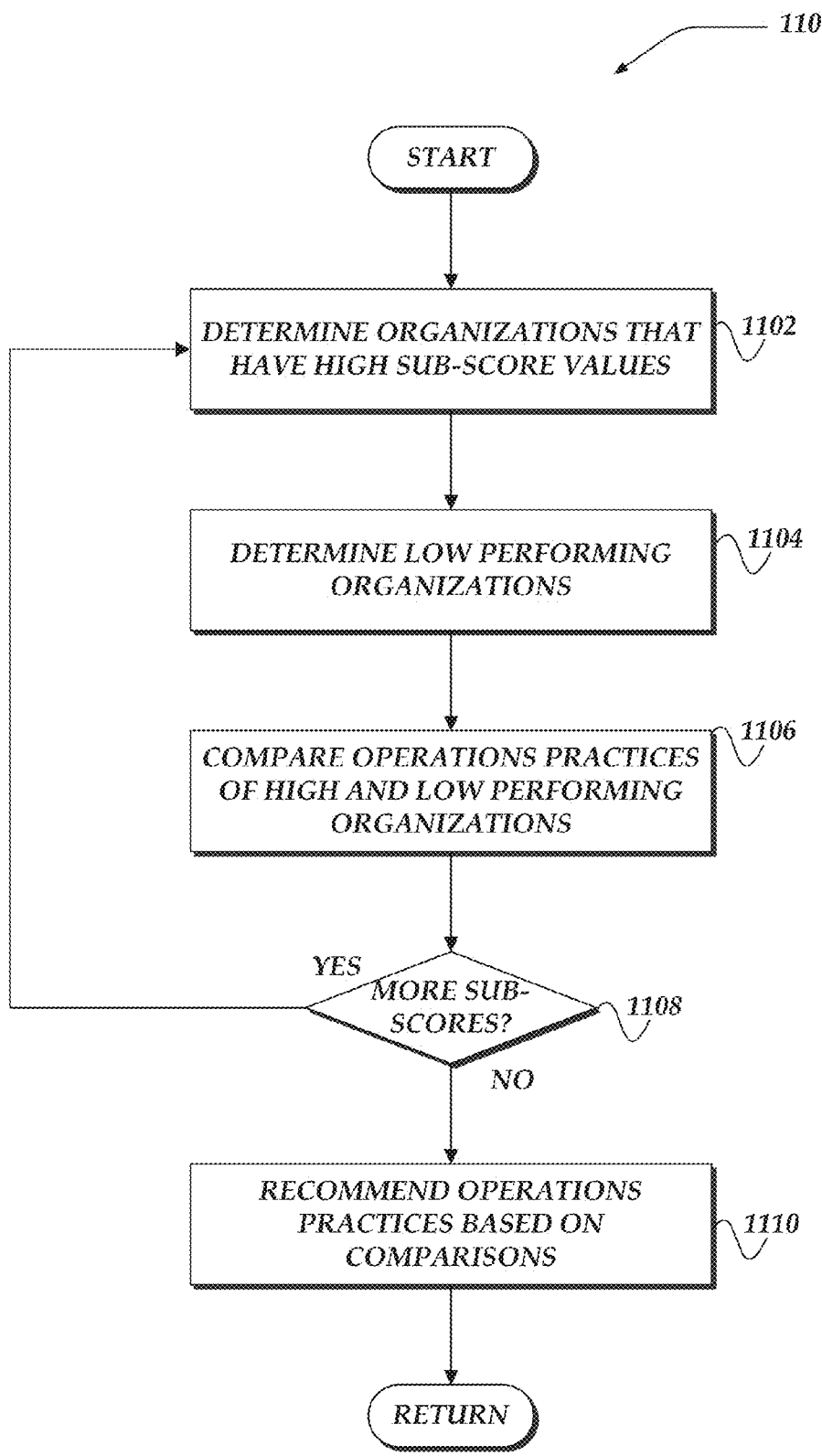
FIG. 11 illustrates a flowchart for a process for generating recommendations for improving operations maturity scores and sub-scores for an organization in accordance with at least one of the various embodiments.

Likewise, in at least one of the various embodiments, these comparisons may be performed for identifying the high performing and low performing aspects of within an organization or between organizations. FIG. 11 illustrates a flowchart for process 1100 for generating recommendations for improving operations maturity scores and sub-scores for an organization in accordance with at least one of the various embodiments. After a start block, at block 1102, in at least one of the various embodiments, for a given sub-score, an operations modeling application, such as, operations modeling application 322, may be arranged identify other organizations in the community that may be have above average score values. In at least one of the various embodiments, these organizations may be considered the high-performing applications in the community. At block 1104, in at least one of the various embodiments, similarly the low performing organizations in the community may be determined. At block 1106, in at least one of the various embodiments, the operations practices of the high and low performing organizations may be determined and/or compared. In at least one of the various embodiments, this comparison may identify one or more practices that may be correlated with the different performances.

At decision block 1108, in at least one of the various embodiments, if there are more sub-scores, control may loop to block 1102; otherwise, control may flow to block 1110. In at least one of the various embodiments, since the operations maturity scores may be comprised of various sub-scores, organizations in the community may be analyzed for each sub-score separately.

At block 1110, in at least one of the various embodiments, one or more recommendations may be determined for improving the operations maturity of the organization being analyzed. In at least one of the various embodiments, the recommendations may be provided in a report that may be stored and/or displayed to a user. In at least one of the various embodiments, the report may be interactive, such that, a user may enable one or more of the recommendation directly from the user interface that shows the report. Next, control may be returned to a calling process.

Also, in at least one of the various embodiments, since the operations maturity score and/or the sub-scores of the organization may be used to compare different departments, groups, teams, or the like, within the same organization. Accordingly, the comparisons may be used identify one or more departments, groups, teams, or the like, that are operating below average or above average.

In at least one of the various embodiments, comparisons may be made to identify performance differences that may exist between different development/software engineering management frameworks, such as, Agile, ITIL, DevOps, waterfall, or the like. Accordingly, an organization can track how different management frameworks affect their operations maturity. This type of comparision may be made between different organizations as well as different team/groups within the same organization.

Likewise, in at least one of the various embodiments, these comparisons may be performed for identifying the high performing and low performing aspects of within an organization or between organizations.

Figure 12:
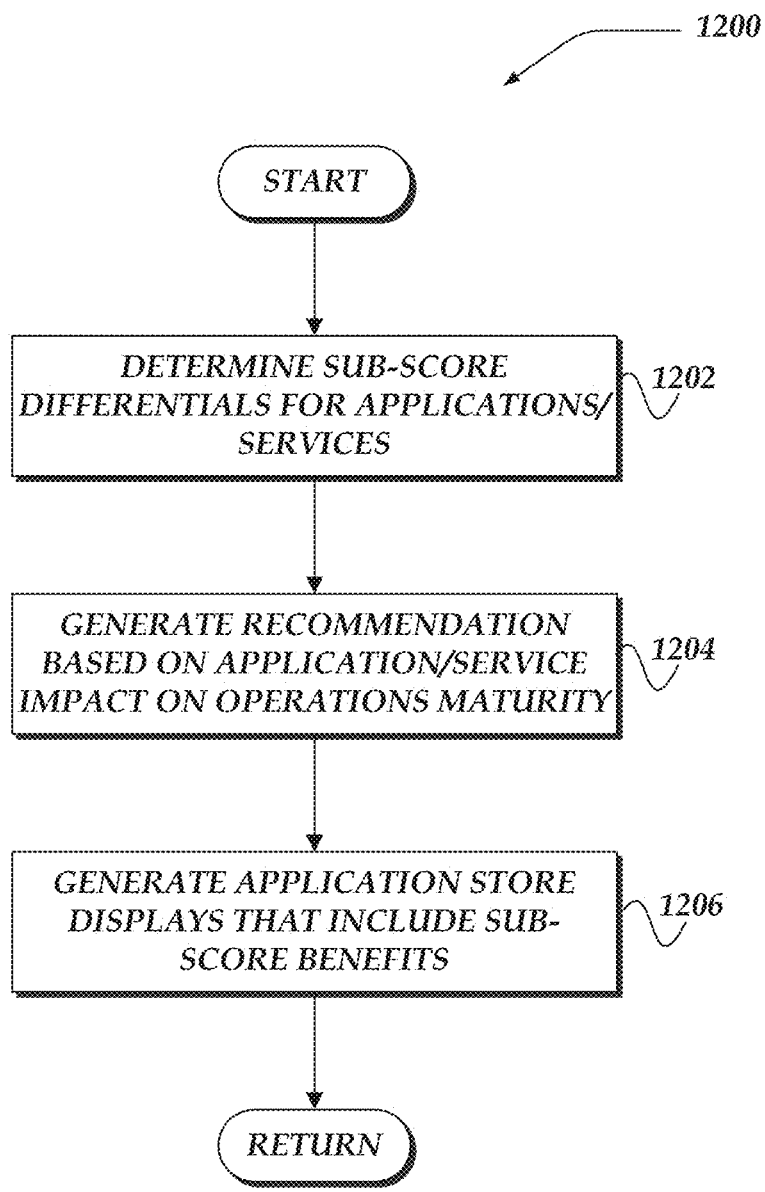
FIG. 12 illustrates a flowchart for a process for generating recommendations for recommendation applications/services based on how they impact operations maturity scores in accordance with at least one of the various embodiments.

FIG. 12 illustrates a flowchart for process 1200 for generating recommendations for recommendation applications/services based on how they impact operations maturity scores in accordance with at least one of the various embodiments. After a start block, at block 1202, in at least one of the various embodiments, operations management systems may provide one or more different applications/services to their customers—the community of organizations that use the operations management system. These services may include various applications that are related to handling operation events (e.g., incidents) that the operations management system encounters for an organization. Such applications/services may include different methods of handling notifications, scheduling resources, different types of event monitoring, or the like. Also, in at least one of the various embodiments, the operations management system may be arranged to support integration with one or more third party service providers that may provide monitoring services, reporting services, notification services, or the like.

In at least one of the various embodiments, the operations modeling application, or the like, may be arranged to analyze each organization to determine the applications/services that they use and determine if there may be a correlation between particular applications/services and improved score values.

In at least one of the various embodiments, the analysis of the effectiveness/impact of the applications may be broken down by category of organization as well. For example, the high impact applications for financial business organizations may be different than the high impact applications for a healthcare organization, and so on.

At block 1204, in at least one of the various embodiments, one or more recommendations may be provided to organizations to employ one or more applications to improve their operations maturity score. In at least one of the various embodiments, the recommendations may be communicated to one or more users associated with an organization.

At block 1206, in at least one of the various embodiments, the operations management system may be arranged to include online application store that displays and highlights the various applications and services that may be available to an organization. Accordingly, in at least one of the various embodiments, one or more applications/services that may be identified as being correlated with improve operations maturity scores and/or sub-scores may be highlighted in the application store. In some embodiments, the highlighting may include text that indicates that organizations that use particular applications may have an average of X % improvement in one or more sub-scores. Next, control may be returned to a calling process.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer-implemented process such that the instructions, which execute on the processor to provide steps for implementing the actions specified in the flowchart block or blocks. The computer program instructions may also cause at least some of the operational steps shown in the blocks of the flowchart to be performed in parallel. Moreover, some of the steps may also be performed across more than one processor, such as might arise in a multi-processor computer system. In addition, one or more blocks or combinations of blocks in the flowchart illustration may also be performed concurrently with other blocks or combinations of blocks, or even in a different sequence than illustrated without departing from the scope or spirit of the invention.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware based systems, which perform the specified actions or steps, or combinations of special purpose hardware and computer instructions. The foregoing example should not be construed as limiting and/or exhaustive, but rather, an illustrative use case to show an implementation of at least one of the various embodiments of the invention.

Further, in one or more embodiments (not shown in the figures), the logic in the illustrative flowcharts may be executed using an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. In at least one embodiment, a microcontroller may be arranged to directly execute its own embedded logic to perform actions and access its own internal memory and its own external Input and Output Interfaces (e.g., hardware pins and/or wireless transceivers) to perform actions, such as System On a Chip (SOC), or the like.

What is claimed as new and desired to be protected by Letters Patent of the United States is:

1. A method for managing operations for organizations over a network, wherein execution of logic by a network computer performs actions, comprising:
   associating one or more events with one or more organizations;
   providing event metric information based on the one or more events for one or more sub-scores;
   providing the one or more sub-scores that are scaled to fit within a defined range;
   providing an operations maturity score for the one or more organizations that is based on a plurality of scaled sub-scores; and
   providing one or more recommendations to increase the operations maturity score for the one or more organizations based on operations maturity scores that correspond to the one or more organizations, wherein the one or more recommendations include one or more correlations of one or more operations practices for managing the one or more events and the one or more sub-scores and also include one or more configuration recommendations for managing the one or more events based on the one or more operations practices that are correlated with above average sub-scores provided by a portion of the one or more organizations that are performing higher than another portion of the one or more organizations.

2. The method of claim 1, wherein providing the one or more sub-scores, further comprises:
   providing the one or more sub-scores that are scaled based on one or more of a plurality of scaling functions;
   when the one or more scaled sub-scores are less than a defined lowest value, setting a value of the one or more scaled sub-scores to the defined lowest value; and
   when the one or more scaled sub-scores exceed a defined highest value, setting the value of the one or more scaled sub-scores to the defined highest value.

3. The method of claim 1, wherein providing the operations maturity score, further comprises:
   providing the one or more sub-scores based on a weighting that corresponds to a contribution of the one or more sub-scores to the operations maturity score; and
   providing one or more values for the one or more weighted sub-scores.

4. The method of claim 1, further comprising, providing a comparison of the one or more sub-scores for the one or more organizations; and
   providing one or more comparisons of the one or more sub-scores to another one or more of the organizations based on a type of organization.

5. The method of claim 1, further comprising:
   sensing geolocation information provided by one or more geolocation devices; and
   employing the sensed information to perform one or more actions, including:
      providing a modification of the one or more sub-scores based at least on the sensed information; or
      localizing the one or more recommendations based at least on the sensed information.

6. The method of claim 1, further comprising, providing an operations maturity trend line based on at least one or more previous sub-scores for the one or more organizations.

7. The method claim 1, further comprising:
   providing an application store that includes a user-interface that at least displays one or more applications that are offered; and
   when the one or more applications are correlated with one or more above average sub-score values, employing a modification of the application store to show an advantage to using the one or more correlated applications.

8. A system arranged for managing operations for organizations over a network, comprising:
   a network computer, including:
      a transceiver that communicates over the network;
      a memory that stores at least instructions; and
      a processor device that executes instructions that enable actions, including:
         associating one or more events with one or more organizations;
         providing event metric information based on the one or more events for one or more sub-scores;
         providing the one or more sub-scores that are scaled to fit within a defined range;
         providing an operations maturity score for the one or more organizations that is based on a plurality of scaled sub-scores; and
         providing one or more recommendations to increase the operations maturity score for the one or more organizations based on operations maturity scores that correspond to the one or more organizations, wherein the one or more recommendations include one or more correlations of one or more operations practices for managing the one or more events and the one or more sub-scores and also include one or more configuration recommendations for managing the one or more events based on the one or more operations practices that are correlated with above average sub-scores provided by a portion of the one or more organizations that are performing higher than another portion of the one or more organizations; and
   another network computer, including:
      a transceiver that communicates over the network;
      a memory that stores at least instructions; and
      a processor device that executes instructions that enable actions, including:
         providing the one or more events.

9. The system of claim 8, wherein providing the one or more sub-scores, further comprises:
   providing the one or more sub-scores that are scaled based on one or more of a plurality of scaling functions;
   when the one or more scaled sub-scores are less than a defined lowest value, setting a value of the one or more scaled sub-scores to the defined lowest value; and
   when the one or more scaled sub-scores exceed a defined highest value, setting the value of the one or more scaled sub-scores to the defined highest value.

10. The system of claim 8, wherein providing the operations maturity score, further comprises:
    providing the one or more sub-scores based on a weighting that corresponds to a contribution of the one or more sub-scores to the operations maturity score; and
    providing one or more values for the one or more weighted sub-scores.

11. The system of claim 8, further comprising, providing a comparison of the one or more sub-scores for the one or more organizations; and
    providing one or more comparisons of the one or more sub-scores to another one or more of the organizations based on a type of organization.

12. The system of claim 8, further comprising:
    sensing geolocation information provided by one or more geolocation devices; and employing the sensed information to perform one or more actions, including:
   providing a modification of the one or more sub-scores based at least on the sensed information; or
   localizing the one or more recommendations based at least on the sensed information.

13. The system of claim 8, further comprising, providing an operations maturity trend line based on at least one or more previous sub-scores for the one or more organizations.

14. The system of claim 8, further comprising:
providing an application store that includes a user-interface that at least displays one or more applications that are offered; and
when the one or more applications are correlated with one or more above average sub-score values, employing a modification of the application store to show an advantage to using the one or more correlated applications.

15. A network computer that manages operations for organizations, comprising:
a transceiver that communicates over the network;
a memory that stores at least instructions; and
a processor device that executes instructions that enable actions, including:
   associating one or more events with one or more organizations;
   providing event metric information based on the one or more events for one or more sub-scores;
   providing the one or more sub-scores that are scaled to fit within a defined range;
   providing an operations maturity score for the one or more organizations that is based on a plurality of scaled sub-scores; and
   providing one or more recommendations to increase the operations maturity score for the one or more organizations based on operations maturity scores that correspond to the one or more organizations, wherein the one or more recommendations include one or more correlations of one or more operations practices for managing the one or more events and the one or more sub-scores and also include one or more configuration recommendations for managing the one or more events based on the one or more operations practices that are correlated with above average sub-scores provided by a portion of the one or more organizations that are performing higher than another portion of the one or more organizations.

16. The network computer of claim 15, wherein providing the one or more sub-scores, further comprises:
providing the one or more sub-scores that are scaled based on one or more of a plurality of scaling functions;
when the one or more scaled sub-scores are less than a defined lowest value, setting a value of the one or more scaled sub-scores to the defined lowest value; and
when the one or more scaled sub-scores exceed a defined highest value, setting the value of the one or more scaled sub-scores to the defined highest value.

17. The network computer of claim 15, wherein providing the operations maturity score, further comprises:
providing the one or more sub-scores based on a weighting that corresponds to a contribution of the one or more sub-scores to the operations maturity score; and
providing one or more values for the one or more weighted sub-scores.

18. The network computer of claim 15, further comprising, providing a comparison of the one or more sub-scores for the one or more organizations; and
providing one or more comparisons of the one or more sub-scores to another one or more of the organizations based on a type of organization.

19. The network computer of claim 15, further comprising:
sensing geolocation information provided by one or more geolocation devices; and
employing the sensed information to perform one or more actions, including:
   providing a modification of the one or more sub-scores based at least on the sensed information; or
   localizing the one or more recommendations based at least on the sensed information.

20. The network computer of claim 15, further comprising:
providing an application store that includes a user-interface that at least displays one or more applications that are offered; and
when the one or more applications are correlated with one or more above average sub-score values, employing a modification of the application store to show an advantage to using the one or more correlated applications.

21. A processor readable non-transitory storage media that includes instructions for managing operations for organizations, wherein execution of the instructions by a processor device enables actions, comprising:
associating one or more events with one or more organizations;
providing event metric information based on the one or more events for one or more sub-scores;
providing the one or more sub-scores that are scaled to fit within a defined range;
providing an operations maturity score for the one or more organizations that is based on a plurality of scaled sub-scores; and
providing one or more recommendations to increase the operations maturity score for the one or more organizations based on operations maturity scores that correspond to the one or more organizations, wherein the one or more recommendations include one or more correlations of the one or more operations practices for managing the one or more events and the one or more sub-scores and also include one or more configuration recommendations for managing the one or more events based on one or more operations practices that are correlated with above average sub-scores provided by a portion of the one or more organizations that are performing higher than another portion of the one or more organizations.

22. The media of claim 21, wherein providing the one or more sub-scores, further comprises:
providing the one or more sub-scores that are scaled based on one or more of a plurality of scaling functions;
when the one or more scaled sub-scores are less than a defined lowest value, setting a value of the one or more scaled sub-scores to the defined lowest value; and
when the one or more scaled sub-scores exceed a defined highest value, setting the value of the one or more scaled sub-scores to the defined highest value.

23. The media of claim 21, wherein providing the operations maturity score, further comprises:
providing the one or more sub-scores based on a weighting that corresponds to a contribution of the one or more sub-scores to the operations maturity score; and
providing one or more values for the one or more weighted sub-scores.

24. The media of claim 21, further comprising, providing a comparison of the one or more sub-scores for the one or more organizations; and providing one or more comparisons of the one or more sub-scores to another one or more of the organizations based on a type of organization.

25. The media of claim 21, further comprising:
sensing geolocation information provided by one or more geolocation devices; and
employing the sensed information to perform one or more actions, including:
   providing a modification of the one or more sub-scores based at least on the sensed information; or
   localizing the one or more recommendations based at least on the sensed information.

26. The media of claim 21, further comprising, providing an operations maturity trend line based on at least one or more previous sub-scores for the one or more organizations.

* * * * *